United States Patent
Kawai et al.

(10) Patent No.: US 7,605,101 B2
(45) Date of Patent: Oct. 20, 2009

(54) LAMINATE, CERAMIC SUBSTRATE AND METHOD FOR MAKING THE CERAMIC SUBSTRATE

(75) Inventors: Shinya Kawai, Kirishima (JP); Tatsuji Furuse, Kirishima (JP); Mieko Yashima, Kirishima (JP); Kouji Yamamoto, Kirshima (JP)

(73) Assignee: KYOCERA Corporation, Kyoto (JP)

( * ) Notice: Subject to any disclaimer, the term of this patent is extended or adjusted under 35 U.S.C. 154(b) by 0 days.

(21) Appl. No.: 11/691,993

(22) Filed: Mar. 27, 2007

(65) Prior Publication Data

US 2007/0287012 A1 Dec. 13, 2007

(30) Foreign Application Priority Data

Mar. 28, 2006 (JP) ............................. 2006-087274
Jan. 29, 2007 (JP) ............................. 2007-017857

(51) Int. Cl.
*C03C 3/064* (2006.01)
*C03C 3/091* (2006.01)
*C03C 3/068* (2006.01)
*C03C 3/095* (2006.01)
*B32B 9/04* (2006.01)
*H01L 33/00* (2006.01)

(52) U.S. Cl. ........................... 501/77; 501/66; 428/446; 257/93

(58) Field of Classification Search ................... 501/88, 501/118, 119, 153, 154; 428/701, 446, 411.1, 428/40.4; 36/321.4; 75/501; 439/55
See application file for complete search history.

(56) References Cited

U.S. PATENT DOCUMENTS

| | | | |
|---|---|---|---|
| 6,579,818 B2 * | 6/2003 | Kawai et al. ................. 501/32 |
| 2004/0159390 A1 * | 8/2004 | Lautzenhiser et al. ..... 156/89.12 |
| 2006/0194032 A1 | 8/2006 | Furuse et al. | |

FOREIGN PATENT DOCUMENTS

| JP | 8-236936 | 9/1996 |
|---|---|---|
| JP | 2001-15875 | 1/2001 |
| JP | 2002-261443 | 9/2002 |
| JP | 2003-69236 | 3/2003 |
| JP | 2004-200679 | 7/2004 |
| JP | 2006-120779 | 5/2006 |

OTHER PUBLICATIONS

Furuse et al. JP 2003-069236 (human translation).*

\* cited by examiner

*Primary Examiner*—David R Sample
*Assistant Examiner*—Nicole T Gugliotta
(74) *Attorney, Agent, or Firm*—Ditthavong Mori & Steiner, P.C.

(57) ABSTRACT

A laminate includes a first green sheet and a second green sheet. The first green sheet includes a first glass including Al and M which is at least one of Sr and Ba. A relationship between Al content and M content is so defined that a position represented by percent by mass of Al in terms of $Al_2O_3$ and percent by mass of M in terms of MO on a coordinate system are on or in a range defined by straight lines connecting point A (1, 21), point B (1, 35), point C (9, 45), point D (20, 45), point E (20, 35), and point F (9, 21) on the coordinate system. The second green sheet includes a second glass including Si and B. The first green sheet is integrally laminated with the second green sheet.

19 Claims, 4 Drawing Sheets

LAMINATE, CERAMIC SUBSTRATE AND METHOD FOR MAKING THE CERAMIC SUBSTRATE

CROSS-REFERENCE TO RELATED APPLICATIONS

The present application claims priority under 35 U.S.C. §119 to Japanese Patent Applications No. 2006-87274, filed Mar. 28, 2006, and No. 2007-17857, filed Jan. 29, 2007, entitled "LAMINATE, CERAMIC SUBSTRATE AND METHOD FOR MAKING THE CERAMIC SUBSTRATE." The contents of these applications are incorporated herein by reference in their entirety.

BACKGROUND OF THE INVENTION

1. Field of the Invention

The present invention relates to a laminate, a ceramic substrate and a method for making the ceramic substrate.

2. Description of the Related Art

In conventional circuit boards including ceramic insulating substrates composed of, e.g., alumina, and wiring layers, a material containing molybdenum, tungsten, or other elements that can withstand high temperatures, as a main component has been used in the wiring layers since the insulating substrate is fired at a temperature of about 1500° C. or more in order to fire the insulating substrate and the wiring layers simultaneously. However, rapid progress in information and communication technology in recent years has brought about an increase in both speed and size of semiconductor elements and other associated components. Accordingly, circuit boards equipped with such elements are required to achieve reduction of signal transmission loss by decreasing the resistance of the wiring layers.

In this respect, a circuit board including a wiring layer mainly composed of silver, copper, or gold with a low conductor resistance and an insulating substrate composed of a low-temperature-sintering ceramic that can be densified at a temperature 1000° C. or less, i.e., the temperature at which the wiring layer does not melt, has been proposed.

The transmission loss of the wiring layer is mainly affected by the conductor resistance for DC signals and low-frequency signals. In contrast, when signals transmitted in the wiring layer have high frequency exceeding several hundred megahertz, the skin effect is the highly influential factor. Skin effect is concentration of electric current in a narrow region about several micrometers in thickness from the interface between the conductor and the insulating substrate or from the surface of the conductor. Thus, when the conductor surface or the interface is rough, the conductor resistance substantially increases at high frequencies. That is, the effective conductivity is decreased. As a result, signal transmission loss is increased.

Therefore, smoothing of the conductor surface or interface is required to increase the effective conductivity and decrease the transmission loss.

A circuit board is usually used with semiconductor elements and the like mounted thereon or by mounting the circuit board on an external circuit board or the like. In order to prevent breaking by thermal stresses caused by the difference in thermal expansion coefficient between the circuit board and the semiconductor element or the external circuit board and by mechanical stresses caused by dropping, vibrations, and the like, the transverse rupture strength of the circuit board must be high.

A glass ceramic that contains a glass powder composed of $SiO_2$, $Al_2O_3$, CaO, MgO, and $B_2O_3$, an $Al_2O_3$ powder, and a celsian ($BaAl_2Si_2O_8$) powder has been proposed as a low-temperature-sintering ceramic having high transverse rupture strength. By using the glass ceramic in the insulating substrate, a circuit board with a low residual carbon content can be obtained even when copper used in the wiring layers is fired in a non-oxidative atmosphere without degrading the ability of removing the organic binder.

Another proposed low-temperature-sintering ceramic with high transverse rupture strength is a glass ceramic containing at least one of a gahnite crystal phase and a spinel crystal phase, a celsian crystal phase including acicular crystals having an aspect ratio of 3 or more, and at least one crystal phase selected from the group consisting of AlN, $Si_3N_4$, SiC, $Al_2O_3$, $ZrO_2$, $Al_2O_3 \cdot 2SiO_2$, and $Mg_2SiO_4$.

However the two proposed circuit boards have a problem in that although the mount reliability can be improved by increasing the transverse rupture strength of the circuit board, firing shrinkage in the X-Y direction (a direction parallel to a main surface of a circuit substrate) caused by firing is large. Accordingly, the dimensional accuracy of the electrode mounted on the circuit board is degraded in the X-Y direction, and it has been difficult to mount a semiconductor element or connector with narrow-pitch terminals, or a small chip component.

On the other hand, demand for smaller, thinner circuit boards is increasing in recent years, and miniaturization of wiring layer patterns is in progress. Thus, in order to increase the dimensional accuracy of the wiring layer in the X-Y direction, there has been proposed a circuit board with a small firing shrinkage in the X-Y direction and a small variation in the firing shrinkage in the X-Y direction, the circuit board being made by preparing and laminating green sheets that undergo firing shrinkage at a low temperature and green sheets that undergo firing shrinkage at a high temperature form a laminate and firing the laminate.

Examples of the green sheets that undergo firing shrinkage at a low temperature include glass ceramic sheets includes a glass containing 10 to 40 percent by mass of $SiO_2$, 35 to 60 percent by mass of MgO, and 10 to 30 percent by mass of $B_2O_3$. Examples of the green sheets that undergo firing shrinkage at a high temperature include glass ceramic sheets including a glass containing 20 to 50 percent by mass of $SiO_2$, 3 to 25 percent by mass of MgO, and 0 to 55 percent by mass of at least one selected from the group consisting of $B_2O_3$, CaO, $Al_2O_3$, SrO, ZnO, $TiO_2$, $Na_2O$, BaO, $SnO_2$, $P_2O_5$, $ZrO_2$, and $Li_2O$.

However, when the above-described green sheet for a circuit board with increased strength is used as a green sheet 2 that undergoes firing shrinkage at a high temperature and this green sheet 2 is used in combination with a green sheet 1 that undergoes firing shrinkage at a low temperature and when these two types of green sheets are laminated and fired in attempt to reduce the variation in firing shrinkage in the X-Y direction, the green sheet 2 rarely undergoes firing shrinkage in the X-Y direction but only in the Z direction. Thus, voids are formed by firing. For example, a thin green sheet with an inter wire layer distance of about 25 μm suffers from degradation in isolated resistance due to the voids generated.

SUMMARY OF THE INVENTION

According to one aspect of the present invention, a laminate includes a first green sheet and a second green sheet. The first green sheet includes a first glass including 10 to 30 percent by mass of Si in terms of $SiO_2$, a total of 5 to 30 percent by mass of at least one of Mg and Zn in terms of MgO and ZnO, respectively, 10 to 30 percent by mass of B in terms of $B_2O_3$, and Al and M which is at least one of Sr and Ba. A relationship between Al content and M content is so defined that a position represented by percent by mass of Al in terms of $Al_2O_3$ and percent by mass of M in terms of MO on a coordinate system are on or in a range defined by straight lines connecting point A (1, 21), point B (1, 35), point C (9, 45), point D (20, 45), point E (20, 35), and point F (9, 21) on the coordinate system. The second green sheet includes a second glass including Si whose percent by mass in terms of $SiO_2$ is larger than the percent by mass of Si in terms of $SiO_2$ of the first glass by 1 to 40 percent by mass, and B whose content in terms of $B_2O_3$ is 3 percent by mass or more and at least 5 percent by mass less than the B content in terms of $B_2O_3$ of the first glass. The first green sheet is integrally laminated with the second green sheet.

According to another aspect of the present invention, a method for making a ceramic substrate includes a step of preparing a first green sheet which includes a first glass containing 10 to 30 percent by mass of Si in terms of $SiO_2$, a total of 5 to 30 percent by mass of at least one of Mg and Zn in terms of MgO and ZnO, respectively, 10 to 30 percent by mass of B in terms of $B_2O_3$, and Al and M which is at least one of Sr and Ba. A relationship between Al content and M content is so defined that a position represented by percent by mass of Al in terms of $Al_2O_3$ and percent by mass of M in terms of MO on a coordinate system are on or in a range defined by straight lines connecting point A (1, 21), point B (1, 35), point C (9, 45), point D (20, 45), point E (20, 35), and point F (9, 21) on the coordinate system. The method further includes a step of preparing a second green sheet which includes a second glass containing Si whose percent by mass in terms of $SiO_2$ is larger than the percent by mass of Si in terms of $SiO_2$ of the first glass by 1 to 40 percent by mass, and B whose content in terms of $B_2O_3$ is 3 percent by mass or more and at least 5 percent by mass less than the B content in terms of $B_2O_3$ in the first glass. The method includes a step of laminating the first green sheet and the second green sheet to prepare a laminate, and a step of firing the laminate by shrinking the first green sheet and then shrinking the second green sheet so that a shrinkage ratio in an X-Y direction parallel to a main surface of each green sheet is 5% or less.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

The embodiments will now be described with reference to the accompanying drawings, wherein like reference numerals designate corresponding or identical elements throughout the various drawings.

Figure 1:
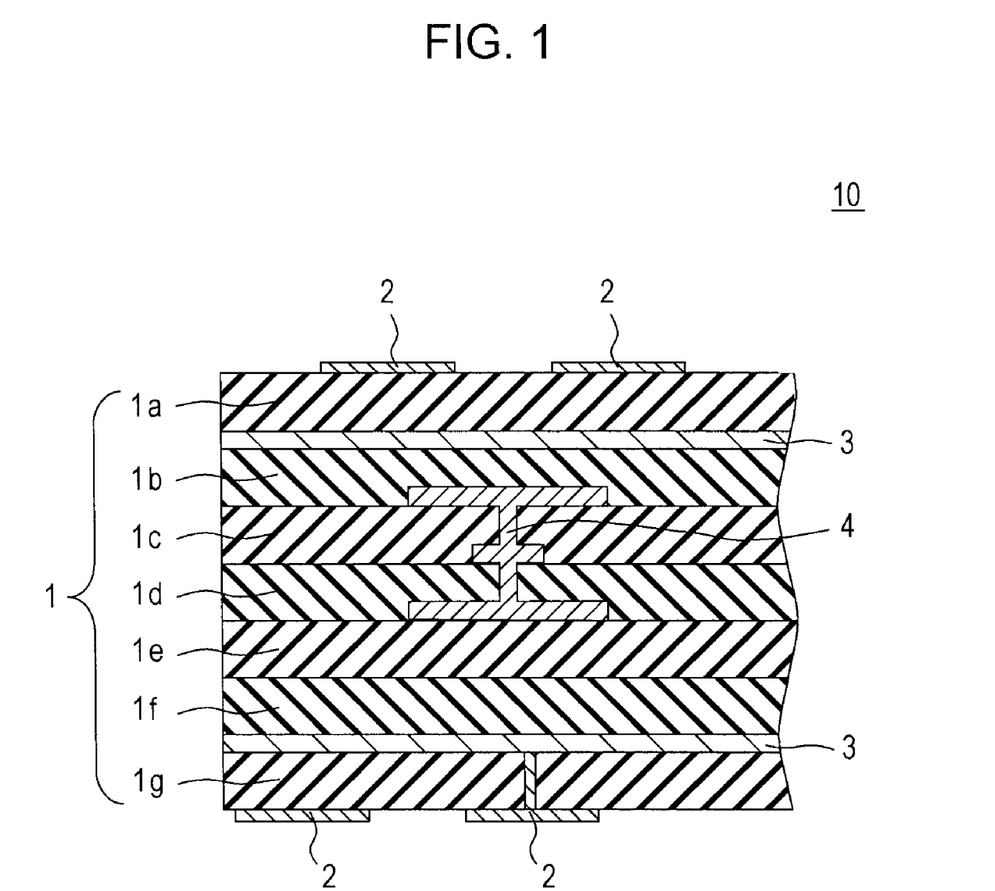
FIG. 1 is a cross-sectional view showing an example of a circuit board according to an embodiment of the present invention.

FIG. 1 is a vertical cross-sectional view of a circuit board according to a first embodiment of the present invention. A circuit board 10 of this embodiment includes an insulating substrate 1; surface conductor layers 2, which are circuit conductor layers, formed on a front surface and a rear surface of the insulating substrate 1; internal conductor layers 3, which are circuit conductor layers inside the insulating substrate 1; and a via hole conductor 4 connecting between the circuit conductor layers.

The insulating substrate 1 is constituted from insulating substrate layers 1a to 1g, and these seven layers are integrated with one another. The insulating substrate layers 1a and 1g are first insulating substrate layers, and the insulating substrate layers 1b to 1f are second insulating substrate layers, composition of which is different from that of the first insulating substrate layers 1a and 1g. The first insulating substrate layers 1a and 1g are formed by firing first green sheets containing a first glass, and the second insulating substrate layers 1b to 1f are formed by firing second green sheets containing a second glass. The number of laminated layers in the insulating substrate 1 may be, for example, 2 to 50. The thickness of the insulating substrate layers 1a to 1g may be 3 to 300 µm each, for example.

In order to prepare the insulating substrate 1, the first green sheets and the second green sheets are stacked to form a laminate and then fired. In order to effectively suppress shrinkage of the laminate, it is preferable to stack the first green sheets and the second green sheets in an alternating fashion, followed by firing the resulting laminate.

The first green sheets may be composed of only the first glass. Similarly, the second green sheet may be composed of only the second glass.

It is essential that the first insulating substrate layers 1a and 1g contain anisotropic crystals having an aspect ratio of 3 or more as the main crystal phase. In this manner, the fracture energy of crystals is improved, and high transverse rupture strength can be obtained.

By improving the interfacial strength between the first insulating substrate layers 1a and 1g and the second insulating substrate layers 1b to 1f, the firing shrinkage in the X-Y direction can be reduced, and dimensional accuracy can be improved.

Moreover, since softening and flowing of the residual first glass sufficiently promotes densification by firing shrinkage, fewer voids are generated and the insulation resistance of the thin layer can be increased.

The anisotropic crystals contained in the first insulating substrate layers 1a and 1g are not particularly limited if they have an aspect ratio of 3 or more. However, the aspect ratio is preferably high. In particular, an aspect ratio of 4 or more is preferred, and 5 or more is yet more preferred.

Anisotropic crystals are crystals having shape anisotropy. To be more specific, acicular or tabular crystals are anisotropic crystals. The major axis is preferably about 1 to 10 µm and the minor axis is preferably about 0.1 to 2 µm. In order for the anisotropic crystals to sufficiently exhibit their advantages, it is preferable that 10 or more, preferably 15 or more, and most preferably 20 or more of anisotropic crystals be contained in a 400 µm2 cross-section of the insulating substrate layer.

The aspect ratio of the anisotropic crystal is an average value of highest ten aspect ratios (major axis/minor axis) selected from anisotropic crystal phases in an arbitrary 20 µm×20 µm region in a 90 µm×120 µm range observed in a polished cross-section of a sintered circuit board with a scanning electron microscope (SEM).

As for the type of anisotropic crystals, hexagonal-system crystals such as alumina, β-alumina, celsian, slawsonite, hexaferrite, β-$Si_3N_4$, and the like are preferable since they preferentially grow in the c-axis direction and have superior mechanical characteristics. In particular, alumina, β-alumina, celsian, and slawsonite increase the transverse rupture strength and freedom of choosing the firing atmosphere. That is, since the firing atmosphere is not limited to reductive or oxidative, the firing atmosphere can be freely chosen according to the conductor material used, for example. Celsian and slawsonite are preferable since they render high transverse rupture strength. Celsian is particularly preferable.

It is also possible to obtain anisotropic particles from other crystal systems such as a cubic system by optimizing the conditions of particle growth and adjustment during milling. Anisotropic particles can be easily obtained by milling lamellar compounds, such as mica and graphite.

Examples of the techniques for incorporating anisotropic crystals include a technique of allowing anisotropic crystals to precipitate from the glass constituting the green sheet during firing, a technique of allowing anisotropic crystals to precipitate as reaction products, and a technique of mixing anisotropic particles to raw materials. In particular, the technique of allowing anisotropic crystals to precipitate from the glass constituting the green sheet during firing and the technique of allowing anisotropic crystals to precipitate as reaction products are preferred since a dense sinter can be easily obtained without decreasing the filling ratio of the sinter. In order to bias the development of cracks to enhance fracture energy and to thereby increase the transverse rupture strength, the directions of the acicular crystals are preferably distributed at random. In this respect, granular crystals may be contained in addition to the anisotropic crystals.

In order to precipitate such anisotropic crystals, selection of the composition of the first green sheet is important. According to an embodiment of the present invention, anisotropic crystals can be precipitated when the first green sheets contains first glass.

Figure 4:
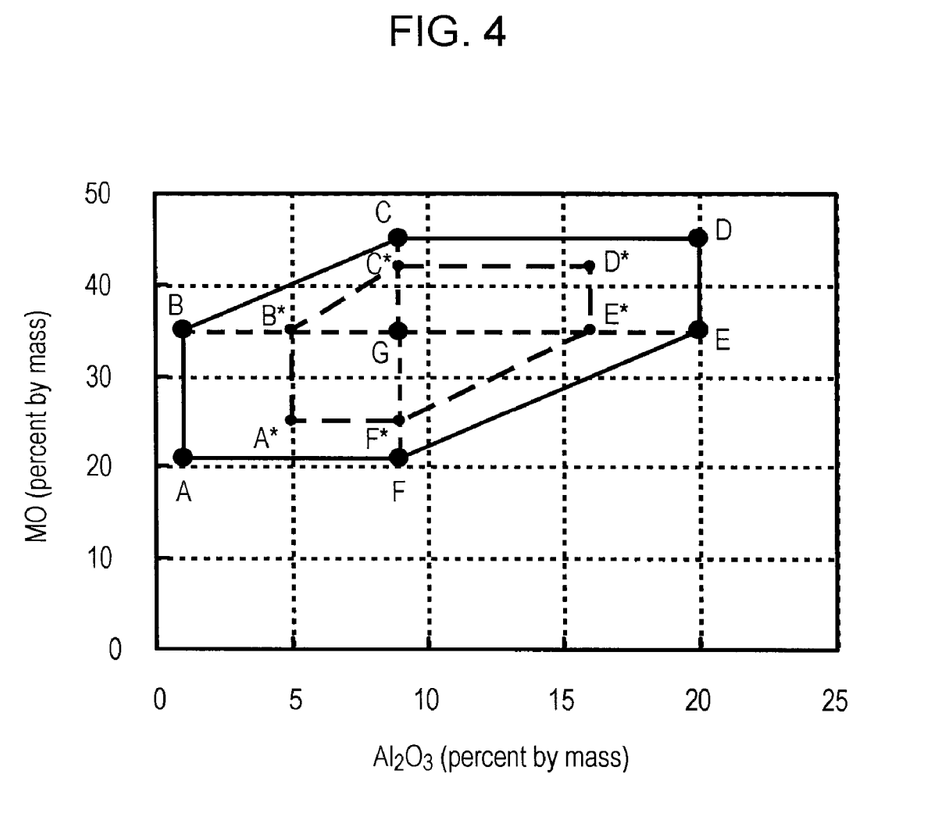
FIG. 4 is a graph showing preferable ranges of the Al and M contents (wherein M is at least one of Sr and Ba) contained in the glass composition included in the first green sheet according to an embodiment of the present invention.

It is important that the first glass contain 10 to 30 percent by mass of Si in terms of $SiO_2$, a total of 5 to 30 percent by mass of Mg and Zn in terms of MgO and ZnO, respectively, 10 to 30 percent by mass of B in terms of $B_2O_3$, and Al and M (M is at least one of Sr and Ba), the contents of which expressed as "(percent by mass in terms of $Al_2O_3$, percent by mass in terms of MO)" being on or in the range defined by straight lines connecting point A (1, 21), point B (1, 35), point C (9, 45), point D (20, 45), point E (20, 35), and point F (9, 21) in the ranges of 1 to 20 percent by mass of $Al_2O_3$ and 21 to 45 percent by mass of MO. FIG. 4 is a graph showing preferable ranges of Al and M.

In order to differentiate the timing of sintering between the first green sheet and the second green sheet and to prevent shrinkage in the X-Y direction and in order to precipitate anisotropic crystals near the interface between the first insulating substrate layer and the second insulating substrate layer to increase the peel strength, selection of composition of the second green sheet is important.

It is important that the second glass have a Si content in terms of $SiO_2$ larger than that of the first glass by 1 to 40 percent by mass and a B content in terms of $B_2O_3$ of 3 percent by mass or more but at least 5 percent by mass less than the B content in terms of $B_2O_3$ of the first glass.

By using the first glass and the second glass having the compositions within the above-described range, the firing shrinkage temperature of the first green sheet can be made lower than that of the second green sheet. As a result, the constraint in the X-Y direction is increased, the firing shrinkage ratio in the X-Y direction can be reduced to 5% or less, and high dimensional accuracy can be achieved.

The firing shrinkage in the X-Y direction is preferably 2% or less and more preferably 1% or less since classification according to ranks can be omitted at the time of component mounting.

Preferably, the BaO content in the first glass is larger than the BaO content in the second glass since the firing shrinkage temperature can be more easily controlled.

The term "firing shrinkage ratio S (%)" is expressed as S=((F−T)/F)×100 (%), wherein F is a predetermined intermarker distance of a green laminate in the X-Y direction and T is a predetermined intermarker distance of the sintered laminate in the X-Y direction.

$SiO_2$ is a network-forming oxide of glass and essential for formation of the glass. $SiO_2$ increases the softening temperature of the glass. When the $SiO_2$ content in the first glass exceeds 30 percent by mass, the firing shrinkage temperature of the first green sheet is increased, sufficient constriction cannot be yielded, and thus firing shrinkage ratio is increased. In contrast, when the $SiO_2$ content in the first glass is less than 10 percent by mass, formation of glass would be difficult. A more preferable range of Si content in the first glass is 13 to 28 percent by mass in terms of $SiO_2$.

When the Si content in the second glass in terms of $SiO_2$ is larger than the Si content in the first glass in terms of $SiO_2$ by more than 40 percent by mass, the firing shrinkage temperature of the second green sheet would be decreased and sufficient constriction would not be attained, resulting in an increased firing shrinkage ratio. In contrast, when the Si content in the second glass in terms of $SiO_2$ is not at least 1 percent by mass larger than the Si content in the first glass in terms of $SiO_2$, the transverse rupture strength may be decreased.

A more preferable range of Si content in the second glass is 10 to 35 percent by mass higher than the Si content in the first glass in terms of $SiO_2$.

$B_2O_3$ is a network-forming oxide for the glass and has a significant effect of decreasing the softening temperature of the glass. When the B content in the first glass is more than 30 percent by mass, the softening point of the first glass would be excessively low, and the first green sheet would not retain its original shape during firing. In contrast, when the B content is less than 10 percent by mass, the firing shrinkage temperature becomes excessively high, and the firing shrinkage ratio in the X-Y direction would be excessively large. A more preferable range of the B content in the first glass is 12 to 25 percent by mass in terms of $B_2O_3$.

When the B content in the second glass is less than 3 percent by mass in terms of $B_2O_3$, the softening and flowing of the glass are not sufficient, and it is difficult to obtain a sufficiently dense insulating substrate layer required for increasing the insulating resistance of the thin layer.

When the B content in the second glass in terms of $B_2O_3$ is not at least 5 percent by mass smaller than the B content in the first glass in terms of $B_2O_3$, the firing shrinkage temperature of the second sheet would be low, sufficient constraint would not be obtained, and the firing shrinkage ratio would be large.

A more preferable range of the B content in the second glass in terms of $B_2O_3$ is 5 percent by mass or more and at least 8 percent by mass smaller than the B content in the first glass in terms of $B_2O_3$.

When the MgO content and the ZnO content are in the above-described range, crystal phases such as spinel, enstatite, forsterite, gahnite, or the like can be precipitated at a low temperature. Thus, the firing shrinkage of the first green sheet can be completed at a low temperature. When the total of the Mg content or the Zn content exceeds the above-described range, residues are easily generated during formation of the glass. In contrast, when the total content is below the above-described range, the firing shrinkage temperature would be high, and the firing shrinkage ratio in the X-Y direction would be large.

A more preferable range of Mg and Zn contents is 8 to 20 percent by mass in total in terms of MgO and ZnO. The Mg content in terms of MgO is preferably larger than the Zn content in terms of ZnO and more preferably the Zn content is zero since chemical resistance can be improved and dielectric loss can be reduced.

When the Al and M (M is at least one of Sr and Ba) contents expressed as "(percent by mass in terms of $Al_2O_3$, percent by mass in terms of MO)" are on or in a range defined by straight lines connecting point A (1, 21), point B (1, 35), point C (9, 45), point D (20, 45), point E (20, 35), and point F (9, 21) in the ranges of 1 to 20 percent by mass in terms of $Al_2O_3$ and 21 to 45 percent by mass in terms of MO, a crystal phase expressed by $MAl_2Si_2O_8$ can be precipitated in the glass. MO has a significantly large effect of decreasing the softening point, and $Al_2O_3$ is a component that stabilizes the glass and increases chemical durability. When the M and Al contents are outside the above-described range, the firing shrinkage temperature of the green sheet 1 would be high and the firing shrinkage ratio in the X-Y direction would be large. Moreover, the transverse rupture strength would decrease, and the insulation resistance of the thin layer and the chemical resistance of the circuit board would be degraded.

A more preferable range of the Al and M contents is on or in the range defined by straight lines connecting point A* (5, 25), point B* (5, 35), point C* (9, 42), point D* (16, 42), point E* (16, 35), and point F* (9, 25), as shown in FIG. 4.

Due to the composition of the first glass, elution resistance of the first insulating substrate layers 1a and 1g in water is high. Thus, the surface of the circuit board 10 can be substantially prevented from being eroded with a plating solution or the like during plating of the surface conductor layer 2 with nickel, gold, solder, or the like, and the transverse rupture strength of the circuit board 10 and the bonding strength of the surface conductor layer 2 after plating can be maintained high.

The first insulating substrate layers 1a and 1g preferably include at least one of celsian and slawsonite having an aspect ratio of 3 or more as the main crystal phase.

These crystal phases can be precipitated as anisotropic crystals in the first glass during firing, can increase the transverse rupture strength, and allow a greater degree of freedom of choosing the firing atmosphere. That is, the firing atmosphere is not limited to reducing or oxidative atmosphere. For example, the firing atmosphere may be freely selected according to the conductive material used. Celsian is particularly preferred since it yields particularly high transverse rupture strength.

Although hexagonal crystals are precipitated as anisotropic crystals in the celsian or slawsonite, other crystal systems, e.g., monoclinic crystal system, may also be incorporated.

Celsian is ideally a crystal phase represented by $BaAl_2Si_2O_8$, and slawsonite is ideally a crystal phase represented by $BaAl_2Si_2O_8$. These crystal phases are not required to have ideal stoichiometric compositions. A solid solution of celsian and slawsonite with or without a third component and a mixture of these crystal phases are also allowed.

In order to increase the aspect ratio of the celsian crystal phase or the slawsonite crystal phase, it is preferable not to allow carbon to remain after removal of the organic binder.

The crystallinity of the first insulating substrate layers 1a and 1g is preferably 75 percent by mass or less and more preferably 70 percent by mass to improve the effective conductivity and increase the insulation of the thin layer.

Incorporation of anisotropic crystals suppresses firing shrinkage of the second green sheet in the X-Y direction during firing without having to increase the crystallinity. Since incorporation of anisotropic crystals also yields high transverse rupture strength, many residual glass phases can be incorporated in the first insulating substrate layers 1a and 1g at a low crystallinity. Since the interface between the conductor and the insulting substrate can be smoothed by the softening and flowing of the residual glass, the interface between the circuit conductor layer and the insulating substrate layer is prevented from becoming rough by the crystal phases. Moreover, the effective conductivity at high frequencies is improved, and the transmission characteristic of the circuit board is enhanced. Since softening and flowing of the residual glass allows sufficient densification by firing shrinkage, fewer voids are generated in the first insulating substrate layer, and the insulation resistance of the thin layer can be increased.

The evaluation of crystallinity was conducted by analyzing the results of the X-ray diffraction (XRD) of the ceramic by a Rietveld refinement technique. A Rietveld refinement technique described in "Handbook of Crystal Analysis" edited by the Crystallographic Society of Japan, Handbook of Crystal Analysis Editing Committee and published by Kyoritsu Shuppan Co., Ltd., September 1999, pp. 492-499 was used.

In particular, a ZnO standard sample was added to an evaluation sample, and an X-ray diffraction pattern in the range of $2\theta = 10°$ to $80°$ measured by a diffractometer method was taken. RIETAN-2000 program was then used to determine the type of crystals and the content thereof in the evaluation sample on the basis of the correlation between the pattern diffracted at the ZnO standard sample and the amount of the ZnO standard sample added to the evaluation sample. The crystallinity is the ratio of the total mass of the crystal phases contained in the sample calculated on the basis of the results thus determined.

The total mass of the crystal phases is the total of all crystal phases contained in the sample. For example, crystal phases precipitated from the glass, unreacted crystalline ceramics contained in the green sheet since before firing, and crystal phases generated by the reaction between glass and ceramic are included.

When the first glass has Al and M (M is at least one of Sr and Ba) contents expressed as "(percent by mass in terms of $Al_2O_3$, percent by mass in terms of MO)" on or in a range defined by straight lines connecting point A (1, 21), point B (1, 35), point G (9, 35), and point F (9, 21), and contains a total of 5 to 20 percent by mass of at least one selected from $Y_2O_3$, CaO, $TiO_2$, and $Na_2O$, anisotropic crystals such as celsian and slawsonite can be more efficiently precipitated, and the firing shrinkage ratio in the X-Y direction can be reduced. In particular, incorporation of $Y_2O_3$ and/or CaO is preferred. A more preferable range of the Al content and the M content expressed as above is on or in the range defined by straight lines connecting point A* (5, 25), point B* (5, 35), point G*

(9, 35), and point F* (9, 25), as shown in FIG. 4. M is preferably Ba since celsian that yields further higher transverse rupture strength can be obtained. A preferable range of the amount of at least one of $Y_2O_3$, CaO, $TiO_2$, and $Na_2O$ is 7 to 15 percent by mass in total.

The first glass may contain 5 to 30 percent by mass of Mg in terms of MgO and 5 to 20 percent by mass of at least one selected from $Y_2O_3$, CaO, SrO, ZnO, $TiO_2$, $Na_2O$, $SnO_2$, $P_2O_5$, $ZrO_2$, and $Li_2O$ in total. When the Mg content is 5 percent by mass or more, chemical resistance can be improved and the dielectric loss can be decreased. Since MgO is more difficult to crystallize than ZnO, the amount of residual glass is increased, and the first insulating substrate layers can be densified. $Y_2O_3$, CaO, SrO, ZnO, $TiO_2$, $Na_2O$, $SnO_2$, $P_2O_5$, $ZrO_2$, and $Li_2O$ are components that promote crystallization. The crystallinity and the crystallization temperature can be controlled in this manner.

When the first glass has an Al content and an M content expressed as "(percent by mass in terms of $Al_2O_3$, percent by mass in terms of MO)" on or within the range defined by the straight line connecting point C (9, 45), point D (20, 45) point E (20, 35), and point G (9, 35), i.e., when the Al content and the Ba content are both increased, anisotropic crystals can be precipitated more efficiently and the firing shrinking ratio in the X-Y direction can be further reduced. In such a case, incorporation of $Y_2O_3$, CaO, $TiO_2$, or $Na_2O$ is not needed. A more preferable range of the Al and M contents is on or within the range defined by the straight lines connecting point C* (9, 42), point D* (16, 42), point E* (16, 35), and point G (9, 35). M is preferably Ba since celsian that yields higher transverse rupture strength can be obtained.

It is preferable that the second glass contain 20 to 60 percent by mass of $SiO_2$, 10 to 25 percent by mass of $Al_2O_3$, 8 to 35 percent by mass of MgO, and 10 to 20 percent by mass of MO (wherein M is at least one of Sr and Ba) and that the second insulating substrate layers 1b to 1f precipitate, by firing, at least one crystal phase selected from a celsian crystal phase and a slawsonite crystal phase including anisotropic crystals having an aspect ratio of 3 or more. In this manner, high transverse rupture strength, a high insulation resistance of the thin layer, and a high effective conductivity at high frequencies can be rendered.

When the second glass is within the above-described ranges, it is possible to precipitate, by firing, celsian crystal phases including anisotropic crystals having an aspect ratio of 3 or more, and the transverse rupture strength of the insulating substrate 1 can be increased. By precipitating at least one of anisotropic celsian and anisotropic slawsonite, the transverse rupture strength can be increased without increasing the crystallinity. Thus, the amount of the flowing residual glass can be increased, and a dense structure with fewer voids can be obtained. Thus, high insulation resistance of the thin layer can be achieved, and the interface between the conductor and the insulating substrate 1 can be smoothed. As a result, a high effective conductivity can be achieved. M is preferably Ba since celsian that can yield higher transverse rupture strength can be obtained.

A more preferable composition for the second glass is 30 to 55 percent by mass of $SiO_2$, 12 to 20 percent by mass of $Al_2O_3$, 10 to 25 percent by mass of MgO, and 12 to 18 percent by mass of MO.

It is preferable to adjust the composition of the second glass within the above-described range and to control the mass ratio of MgO to $SiO_2$ ($MgO/SiO_2$) to 0.20 to 0.87.

in this manner, the ratio of other crystal phases containing MgO to celsian can be adequately controlled, and the second glass after firing will contain celsian crystal phases containing anisotropic crystals while attaining high crystallinity. When the mass ratio, $MgO/SiO_2$ is 0.20 to 0.87, the crystallinity of the glass after firing is increased, and the amount of components in an amorphous state is decreased. Thus, the dielectric loss, in particular, the dielectric loss at high frequencies, can be decreased. The range of mass ratio $MgO/SiO_2$ is preferably 0.25 to 0.85 and more preferably 0.40 to 0.80.

When the first insulating substrate layers 1a and 1g contain the same anisotropic crystals as those in the second insulating substrate layers 1b to 1f, anisotropic crystals precipitated by firing easily grow across the interface between one insulating substrate layer and another insulating substrate layer. As a result, the interfacial strength is increased, and the bonding between the first insulating substrate layer 1a and the second green sheet or the second insulating substrate layer 1b and between the first insulating substrate layer 1g and the second green sheet or the second insulating substrate layer 1f is strengthened. As a result, the firing shrinkage in the X-Y direction can be further suppressed, and delamination caused by the difference in firing shrinkage or stresses generated between the layers with different compositions due to the difference in thermal expansion coefficient can be prevented.

The dielectric loss of the first insulating substrate layers 1a and 1g and the second insulating substrate layers 1b to 1f at a measurement frequency of 800 MHz to 10 GHz is preferably 0.003 or less and more preferably 0.002 or less.

In this manner, energy loss can be reduced at the time of forming high-frequency elements, such as strip lines, filters, and baluns, on the circuit board 10 and the performance of the element can be improved.

The dielectric loss of the insulating substrate layers was determined as a dielectric loss of a cylindrical sample having a diameter of 8 mm and a height of 6 mm near a frequency of 10 GHz by a dielectric cylindrical resonator method. Since the measurement frequency varies with samples, the value observed at 10±1 GHz was assumed as the observed value at 10 GHz.

Typically, since the dielectric loss of glass increases with the frequency, the observed dielectric loss value at 10 GHz was assumed as the maximum value of the dielectric loss in 800 MHz to 10 GHz.

The second glass is preferably substantially free of ZnO and $TiO_2$. This is because when these components are contained as the glass components, the dielectric loss of the second insulating substrate layers 1b to 1f is high.

The phrase "substantially free of" means that these components are not intentionally added. These components may be contained as inevitable impurities. The ZnO content and the $TiO_2$ content in the glass composition is preferably 0.1 percent by mass or less and more preferably 0.05 percent by mass or less.

The first green sheet contains 30 to 100 percent by mass of the first glass and 0 to 70 percent by mass of a first ceramic. The second green sheet contains 30 to 100 percent by mass of the second glass and 0 to 70 percent by mass of a second ceramic (excluding the case where the first ceramic content and the second ceramic content are both 0 percent by mass).

When the ratio of the ceramic in the inorganic composition contained in the first green sheets, which form the first insulating substrate layers 1a and 1g, is high, the transverse rupture strength of the circuit board is increased. When the ratio of the glass is increased, the sinterability is increased. Thus, the inorganic composition contained in the first green sheets that form the first insulating substrate layers 1a and 1g preferably contain 30 to 100 percent by mass of the first glass and 0 to 70 percent by mass of the first ceramic. More preferably, the first glass content is 40 to 90 percent by mass and the first ceramic content is 10 to 60 percent by mass, and most preferably, the first glass content is 50 to 80 percent by mass and the first ceramic content is 20 to 50 percent by mass.

When the ratio of the ceramic in the inorganic composition contained in the second green sheets which form the second insulating substrate layers $1b$ to $1f$ is high, the transverse rupture strength of the circuit board is increased. When the ratio of the glass is high, the sinterability is increased. Thus, the inorganic composition in the second green sheets which form the second insulating substrate layers $1b$ to $1f$ preferably contains 30 to 100 percent by mass of the second glass and 0 to 70 percent by mass of the second ceramic, more preferably 40 to 90 percent by mass of the second glass and 10 to 60 percent by mass of the second ceramics, and most preferably 50 to 80 percent by mass of the second glass and 20 to 50 percent by mass of the second ceramic.

By inhibiting the breaking of the insulting substrate layer, the bonding strength of the surface conductor layer 2 can be increased.

The first ceramic and the second ceramic are not particularly limited as far as the characteristics of the present invention are not impaired. The characteristics of the first and second insulating substrate layers can be adjusted according to needs by appropriately using $Al_2O_3$, $SiO_2$, $MgTiO_3$, $CaZrO_3$, $CaTiO_3$, $BaTi_4O_9$, $SrTiO_3$, $ZrO_2$, $TiO_2$, $Mg_2Al_4Si_5O_{18}$, $AlN$, $Si_3N_4$, and the like.

Among these, $Al_2O_3$, $CaZrO_3$, and $ZrO_2$ are preferable since they increase the transverse rupture strength. $Al_2O_3$, $SiO_2$, $MgTiO_3$, $CaTiO_3$, and $BaTi_4O_9$ are preferred since they decrease the dielectric loss. $Al_2O_3$, $SiO_2$, $MgTiO_3$, $CaTiO_3$, and $BaTi_4O_9$ are preferred since they increase the thermal conductivity of the circuit board. While $SiO_2$ (quartz or cristobalite) increases the thermal expansion coefficient, $SiO_2$ (amorphous=silica glass) and $Mg_2Al_4Si_5O_{18}$ are preferred since they decrease the thermal expansion coefficient. Considering the dielectric characteristic and the transverse rupture strength together, $Al_2O_3$ is more preferable.

The green sheet may contain $ZnO$ and $TiO_2$ as the ceramic filler component separately from the glass composition. When the firing temperature is 900° C. to 1,000° C., which is lower than the melting point of the second glass, diffusion of the ceramic filler component is little, and the dielectric loss does not increase significantly by the diffusion.

The softening temperature of the first glass is preferably lower than the softening temperature of the second glass since the firing shrinkage in the X-Y direction can be mutually suppressed, variation in the firing shrinkage amount in the X-Y direction can be suppressed, and the firing shrinkage amount in the X-Y direction can be made close to zero. This is because the firing shrinkage of the second green sheets that form the second insulating substrate layers $1b$ to $1f$ starts from the time when the firing shrinkage of the first green sheets that form the first insulating substrate layers $1a$ and $1g$ is nearly completed. In other words, firing shrinkage of the second green sheets does not occur during firing shrinkage of the first green sheets, and the first insulating substrate layers $1a$ and $1g$ are already shrunk (i.e., firing shrinkage does not occur) during firing shrinkage of the second green sheets.

In order to more effectively suppress firing shrinkage in the X-Y direction, the softening point of the first glass is preferably at least 10° C., more preferably at least 40° C., and most preferably at least 90° C. lower than the softening point of the second glass.

Note that the phrase "firing shrinkage is nearly completed" means that firing shrinkage of 97% or more, in particular, 98% or more, and preferably 99% or more of the final sinter volume shrinkage amount has already occurred.

The BaO content in the second glass is preferably at least 10 percent by mass higher than the BaO content in the first glass since the softening temperature of the first glass can be decreased to a further lower temperature from the softening temperature of the second glass.

The first glass is preferably crystallizable glass that can form crystals by firing. When the first insulating substrate layers $1a$ and $1g$ formed by firing the first green sheets contain crystals, the first insulating substrate layers $1a$ and $1g$ are not easily deformable and can adequately suppress firing shrinkage of the second green sheets that form the second insulating substrate layers $1b$ to $1f$, and the amount of firing shrinkage of the laminate constituted from the green sheets in the X-Y direction can be decreased.

The crystallization temperature of the first glass is preferably lower than the firing shrinkage start temperature of the second green sheets that form the second insulating substrate layers $1b$ to $1f$. Furthermore, the crystallization temperature of the first glass is preferably lower than the softening point of the second green sheets.

The firing shrinkage start temperature of the first green sheets is preferably lower than the firing shrinkage start temperature of the second green sheets, since the firing shrinkage in the X-Y direction can be mutually suppressed, variation in firing shrinkage amount in the X-Y direction can be suppressed, and the firing shrinkage amount in the X-Y direction can be made close to zero.

In particular, when the firing shrinkage start temperature of the first green sheets is at least 10° C., more preferably at least 50° C., and most preferably at least 100° C. lower than the firing shrinkage start temperature of the second green sheets, the overlap of the temperature zones in which these two types of green sheets undergo firing shrinkage is decreased.

In firing, the relationship $T1<TS1<T2<TS2$ is preferably satisfied, wherein T1 is the firing shrinkage start temperature of the first green sheet, TS1 is the softening temperature of the first glass, T2 is the firing shrinkage start temperature of the second green sheet, and TS2 is the softening temperature of the second glass measured with thermal mechanical analysis (TMA) or differential thermal analysis (DTA).

It is also possible to conduct multi-step firing in which the temperature is temporarily held between the firing shrinkage start temperature T1 of the first green sheets and the firing shrinkage start temperature T2 of the second green sheets. However, the first and second green sheets can be simultaneously sintered by a usual process of firing by keeping the single temperature to form a circuit board with high dimensional accuracy since the firing shrinkage in the X-Y direction is suppressed and firing shrinkage occurs in the Z direction.

The difference in thermal expansion coefficient between the first insulating substrate layers $1a$ and $1g$ and the second insulating substrate layers $1b$ to $1f$ in the range of 40° C. to 900° C. is preferably $2 \times 10^{-6}$/° C. or less. However, incorporation of the anisotropic crystals in the first insulating substrate layers $1a$ and $1g$ as described above increases the interfacial strength; thus, delamination by firing or the like can be suppressed even when the difference in thermal expansion coefficient is outside this range as a result.

When the difference in thermal expansion coefficient is $2 \times 10^{-6}$/° C. or less, cracks and delamination at the interface between the first insulating substrate layers $1a$ and $1g$ and the second insulating substrate layers $1b$ to $1f$ due to the difference in thermal expansion coefficient can be suppressed during cooling from the maximum firing temperature. In order to suppress cracks and delamination, the difference in thermal expansion coefficient is preferably $1 \times 10^{-6}/°$ C. or less. However, as described above, since incorporation of anisotropic crystals in the first insulating substrate layers 1a and 1g increases the interfacial strength, delamination and the like during firing can still be suppressed even when the difference in thermal expansion coefficient is outside this range.

The average thermal expansion coefficient was measured according to Japanese Industrial Standard (JIS) R3102. Test pieces were prepared from the circuit board 10. In particular, each test piece is prepared by polishing or the like so that the insulating substrate layer has a single composition. When a conductor layer is provided inside or around the insulating substrate layer having a single composition, a test piece including the conductor layer is prepared. When a test piece having dimensions set forth in JIS R3102 cannot be prepared from the circuit board 10, a rectangular parallelepiped or cylinder is cut out from the insulating substrate 1 such that the portion at which the length is measured is as close to the prescribed dimension as possible, and the two end faces of the portion in which the length is measured are polished so that the end faces are parallel to each other to thereby prepare a test piece.

The first insulating substrate layers 1a and 1g and the second insulating substrate layers 1b to 1f may contain arbitrary crystal phases other than celsian and slawsonite as far as the features of the present invention are not impaired.

Examples of the first and second ceramics include $Al_2O_3$, $SiO_2$, $MgTiO_3$, $CaZrO_3$, $CaTiO_3$, $BaTi_4O_9$, $SrTiO_3$, $ZrO_2$, $TiO_2$, $Mg_2Al_4Si_5O_{18}$, AlN, and $Si_3N_4$. Examples of the crystal phases incorporated include diopside, forsterite, enstatite, anorthite, spinel, and mullite crystal phases. By appropriately using these ceramics and crystal phases, the characteristics of the first insulating substrate layers 1a and 1g and the second insulating substrate layers 1b to 1f can be controlled according to need. In particular, diopside, enstatite, forsterite, and $Al_2O_3$ are preferred, and $Al_2O_3$ is particularly preferred considering the dielectric characteristic and the transverse rupture strength together.

The first green sheet and the second green sheet can be sintered at 1000° C. or less, and a low-resistance conductor such as Cu, Ag, or Au can be used in the conductor layer. As described above, the first insulating substrate layers 1a and 1g and the second insulating substrate layers 1b to 1f are suitable for decreasing the dielectric constant and are thus suitable for circuit boards that require high-speed signal transmission.

Although the configuration of the insulating substrate layers of the circuit board 1 is described as including the first insulating substrate layers 1a and 1g and the second insulating substrate layers 1b to 1f, the configuration of the insulating substrate layers is not limited to this. For example, layers 1b to 1f may be the first insulating substrate layers while layers 1a and 1g may be the second insulating substrate layers. Another example is a configuration including layers 1a, 1c, 1e, and 1g which are first insulating substrate layers and layers 1b, 1d, and 1f which are second insulating substrate layers. In order to reduce warpage of the insulating substrate 1, the layer configuration is preferably substantially symmetrical in the lamination direction. It is also possible to form a capacitor using the insulating substrate layer with a high dielectric constant and a strip line or filter using the insulating substrate layer with low dielectric loss by utilizing the difference in dielectric characteristic between the first insulating substrate layers and the second insulating substrate layers.

Figure 2:
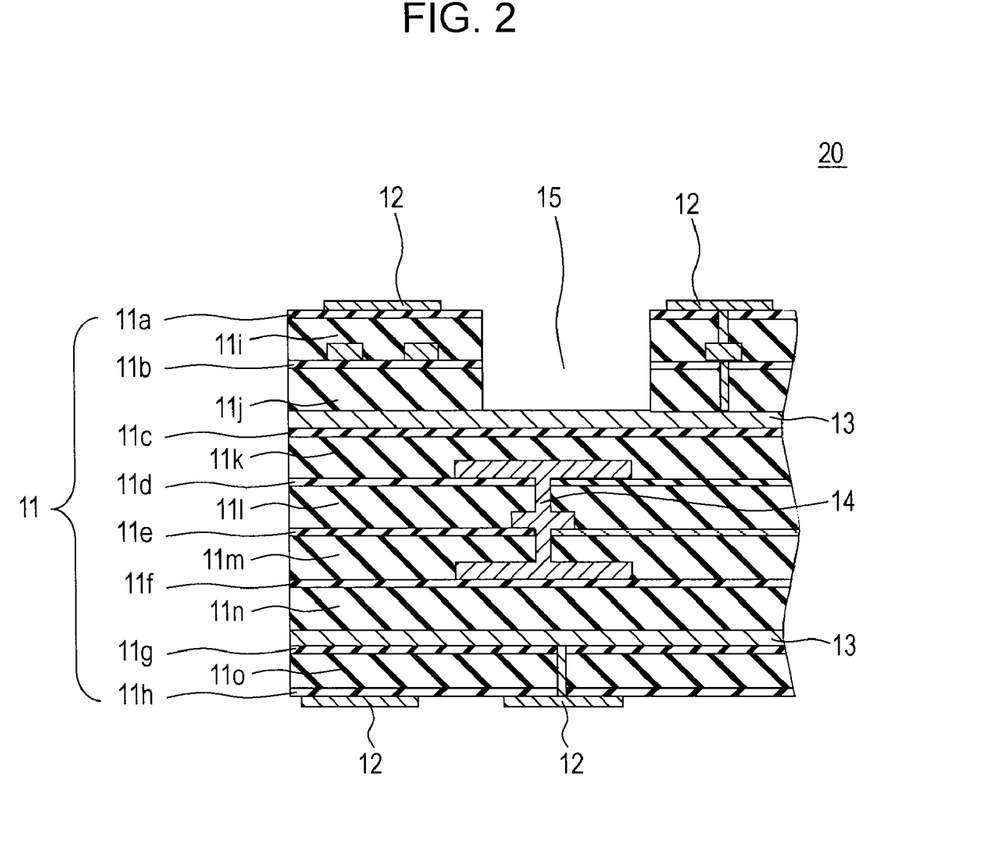
FIG. 2 is a cross-sectional view of another example of the circuit board according to an embodiment of the present invention.

FIG. 2 is a vertical cross-section of a circuit board of another embodiment of the present invention.

A circuit board 20 of this embodiment includes an insulating substrate 11, surface conductor layers 12 formed on front and rear surfaces of the insulating substrate 11, internal conductor layers 13 formed inside the insulating substrate 11, and a via hole conductor 14 connecting between the conductors. A cavity 15 is formed in part of the insulating substrate 11. A semiconductor element, a chip component, or the like can be mounted in the cavity 15, for example.

The insulating substrate 11 is constituted from fifteen insulating substrate layers 11a to 11o laminated and integrated with each other. Layers 11a to 11h are first insulating substrate layers and layers 11i to 11o are second insulating substrate layers having a composition different from that of the first insulating substrate layers 11a to 11h. The first insulating substrate layers 11a to 11h are formed by firing first green sheets each containing a first glass, and the second insulating substrate layers 11i to 11o are formed by firing second green sheets each containing a second glass. The thickness of the first insulating substrate layers 11a to 11h is about 10 μm each, and the thickness of the second insulating substrate layers 11i to 11o is about 60 μm each. The number of layers in the insulating substrate 11 may be 2 to 50, for example. The thickness of the first insulating substrate layers 11a to 11h may be, for example, 3 to 150 μm each, and the thickness of the second insulating substrate layers 11i to 11o may be, for example, 10 to 300 μm each.

The material for the first and second insulating substrate layers can be designed to render different specific dielectric constant, transverse rupture strength, dielectric loss, thermal conductivity, bulk density, temperature coefficient, etc., to meet the need.

Furthermore, although the first insulating substrate layers (A) and the second insulating substrate layers (B) are laminated as ABBBBBA in FIG. 1, other arrangements, such as ABABABA, AAABAAA, AABBBAA, AABABAA, AABBAAA, ABAAAAA, ABAAABA, ABBABBA, AABAAAA, ABBAAAA, ABBBAAA, and ABBBBAA are also possible. Also, the arrangement of As and Bs may be reversed.

Third insulating substrate layers may also be used in addition to the first and second insulating substrate layers. There may be two or more types of insulating substrate layers in addition to the first and second insulating substrate layers.

A method for making the circuit board according to an embodiment of the present invention is described next.

The first and second green sheets are made using the powders described above. Each green sheet is prepared by mixing a predetermined ceramic powder composition, an organic binder that readily decomposes during firing, and a plasticizer (optional) to prepare a slurry, forming the slurry into tapes by a known forming method such as a lip coater method and a doctor blade method, and cutting the resulting tapes into predetermined dimensions to prepare a green sheet. Note that in some cases, one of the first and second green sheet may be prepared by forming insulating layers by a known printing method such as screen printing and gravure printing using a paste instead of using the green sheets.

Penetrating holes are formed in these green sheets by punching or with a laser, and a conductor paste is filled in the penetrating holes. The surface conductor layers and internal conductor layers are formed by applying a conductor paste by means of screen-printing or the like.

The green sheets thus prepared are laminated according to a predetermined order of lamination of the first and second green sheets to form a laminate, and the laminate is then fired.

As the firing shrinkage of the first green sheets starts, the second green sheets suppress the firing shrinkage in the X-Y direction. Upon completion of the firing shrinkage of the first green sheets, the first green sheets suppress the firing shrinkage of the second green sheets in the X-Y direction as the sintering of the second green sheets progresses. As a result, the firing shrinkage in the X-Y direction can be suppressed as a multilayer circuit board as a whole after completion of the sintering. Moreover, since the softening point of the glass contained in the first green sheets is lower than the softening point of the glass powder contained in the second green sheets, the firing shrinkage ratio can be made close to zero, and a circuit board with high dimensional accuracy can be provided.

As is described above, the embodiment of the present invention can provide a circuit board having high transverse rupture strength, small firing shrinkage in the X-Y direction, and high insulation resistance of thin layers can be provided.

EXAMPLES

Green sheets were prepared. A glass powder and a ceramic powder were mixed with a methacrylic resin as an organic binder, toluene as an organic solvent, and a plasticizer according to Tables 1 and 2 to prepare a slurry. The slurry was formed into green sheets by a doctor blade method to prepare green sheets for a multilayer circuit board.

The softening temperature TS1 of the glass contained in the first green sheet and the softening temperature TS2 of the glass contained in the second green sheet were determined from a curve obtained by DTA while increasing the temperature at a rate of 10° C./min. The results are shown in Tables 1 and 2.

The firing shrinkage start temperature S and the shrinkage end temperature E of each green sheet are shown in Table 3. These values are obtained by preparing a green compact by adding wax to the composition of each green sheet shown in Tables 1 and 2, pressing the resulting mixture at 100 MPa and subjecting the green compact to TMA in air in the temperature range of 40° C. to 1000° C. to measure the firing shrinkage start temperature SA, the firing shrinkage end temperature SE, and the thermal expansion coefficient at 40° C. to 900° C. of each glass ceramic or glass. Note that the firing shrinkage start temperature SA is the temperature at which 3% firing shrinkage is observed at high-temperature-side of the point at which the maximum thermal expansion of the green compact is observed. The firing shrinkage end temperature SE is the temperature at which firing shrinkage 3% less than the maximum firing shrinkage brought about by sintering the green compact is observed at the low-temperature-side of the point of the maximum firing shrinkage.

The transverse rupture strength of the first and second insulating substrate layers was determined by forming a 3 mm×4 mm×50 mm test piece from a sinter of each insulating substrate layer and measuring three-point bending strength of the sample according to JIS R-1601 using an autograph.

The dielectric loss of the first and second insulating substrate layers was determined as follows. Each composition shown in Tables 1 and 2 was compression-molded at a pressure of 100 MPa into a cylinder having a diameter of 10 mm and a height of 8 mm as a sample for evaluating the dielectric characteristic. The resulting sample was fired for 1 hour at 910° C. and a cylindrical sample having a diameter of 8 mm and a height of 6 mm was obtained as a result. Evaluation of the dielectric characteristic was conducted by measuring the dielectric loss near a frequency of 10 GHz by a dielectric cylindrical resonator method.

Through holes were formed at predetermined positions in the green sheets by punching or the like, and a conductive paste containing Ag powder was filled in these through holes. The conductive paste was also applied on the surfaces of the green sheets by screen printing to form wiring patterns and then dried. The resulting green sheets were stacked to form a laminate having the same configuration as that shown in FIG. 1. That is, the first green sheets were arranged to be the topmost and bottom most layers, and the second green sheets were interposed between the first green sheets to form a laminate of the green sheets. The green sheets shown in Table 3 were chosen as the first and second green sheets.

The resulting laminate was heated in air at 400° C. to remove the organic binder and then fired at 910° C. to make a circuit board shown in FIG. 1.

The thickness of the insulating substrate layers 1a to 1g was 0.1 mm each. The circuit substrate was 10 mm in length, 10 mm in width, and 0.7 mm in thickness. Subsequently, the firing shrinkage ratio of the circuit board in the X-Y direction was determined from the distance between predetermined points on the laminate measured prior to firing and the distance between the same points on the circuit board after firing.

The warpage of the circuit board was evaluated as follows. A Ag conductor is applied by printing on only one surface of the circuit board having the above-described layer configuration after the firing to form a 5 mm×5 mm square pattern thereon and then the circuit board and the Ag conductor were simultaneously fired to prepare a sample. Irregularities in the surface of a 4.6 mm×4.6 mm region in the 5 mm×5 mm square pattern were analyzed with a laser displacement profiler at a measurement pitch of 50 μm for both X and Y directions and a rate of 2000 μm/sec, and the difference between the highest point and the lowest point was assumed as the warpage.

The surface of the circuit board was polished and observed with a 20× stereoscopic microscope to study presence or absence of the cracks in the circuit board. Presence or absence of delamination was studied by observing a fracture surface of the circuit board with a 100× optical microscope. If delamination or cracks were present, the sample was evaluated as defective.

The crystals of the first and second insulating substrate layers of the circuit board were evaluated as follows. The crystal phases incorporated in the first and second insulating substrate layers were identified from an X-ray diffraction (XRD) pattern (2θ=10° to 80°). While using ZnO as a standard sample, the crystallinity of the first and second insulating substrate layers was determined by a Rietveld method. The aspect ratio of the anisotropic crystals of the first and second insulating substrate layers was measured. The aspect ratio was an average value of ten crystals having largest aspect ratios (major axis/minor axis) in a 20 μm×20 μm arbitrary region in the photograph in the range of 90 μm×120 μm observed in a mirror-polished vertical cross section of a sinter with a 1000× scanning electron microscope (SEM).

Figure 3A:
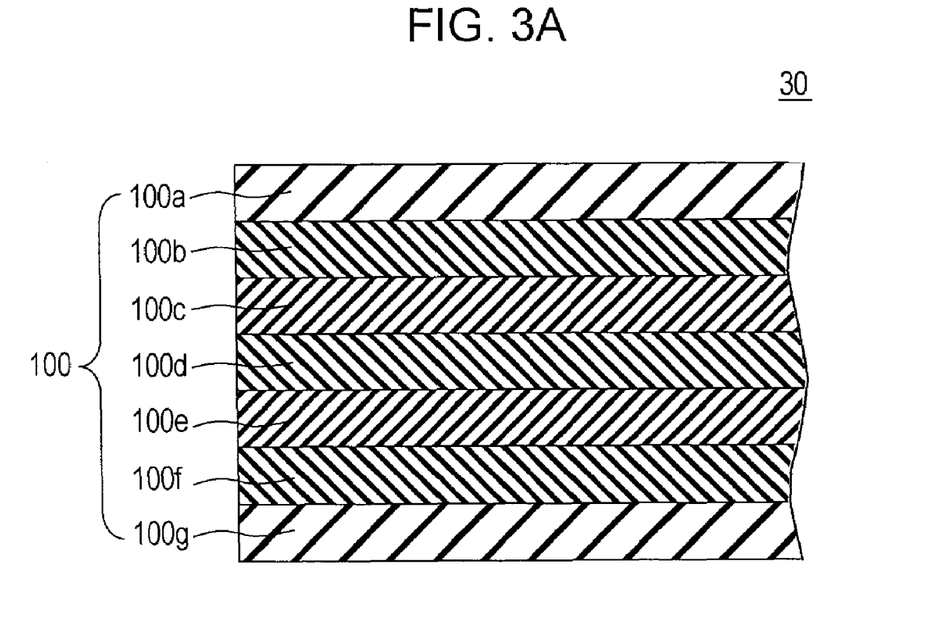
FIGS. 3A and 3B each show an example of the circuit board according to an embodiment of the present invention, which is a cross-sectional view of a sample for measuring transverse rupture strength.
Figure 3B:
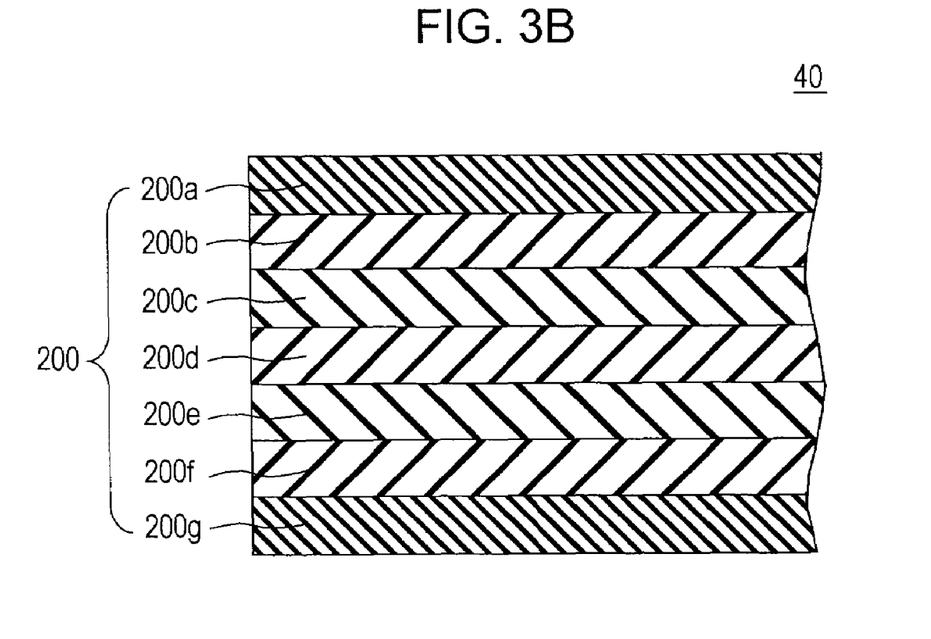

In order to evaluate the transverse rupture strength of the circuit board in which the first and second insulating substrate layers are integrally laminated, circuit boards having layer configurations shown in FIGS. 3A and 3B not including conductor layers and the like were prepared in which the thickness of the insulating substrate layers was 100 μm each. A circuit board 30 included first insulating substrate layers 100a and 100g and second insulating substrate layers 100b to 100f integrally laminated with each other. A circuit board 40 included first insulating substrate layers 200b to 200f and second insulating substrate layers 200a and 200g integrally laminated with each other. Each of the circuit board 30 and the circuit board 40 was processed to 0.7 mm (thickness)×4 mm×50 mm (surface was not polished), and three-point bending strength was measured using an autograph according to JIS R-1601 except for the thickness and surface finishing. The value of the transverse rupture strength of one of circuit boards 30 and 40 that exhibited higher transverse rupture strength is indicated in Table 3.

A sample having first and second insulating substrate layers each 25 μm in thickness as inner layers and twenty-two 1 mm×1 mm square counter electrodes disposed on the upper and lower outer surfaces was prepared. High-temperature high-humidity bias test (85° C., 85 RH %, DC: 10 V) was conducted for 1000 hours, and insulation resistance after testing was measured. The minimum value is shown in Table 3. Note that the sample that exhibited an insulation resistance of 109 Ω or more was evaluated as PASS.

Evaluation results of comparative examples having first insulating substrate layers outside the preferable range are shown in Tables 1 and 3. Evaluation results of comparative examples having combinations of the first and second insulating substrate layers outside the preferable range are shown in Table 3. Whether the second insulating substrate layer is in the range of an embodiment of the present invention or not is determined by the combination with the first insulating substrate layer. Thus, asterisk marks indicating samples outside the preferable range are not inserted in Table 2. Moreover, among the circuit board characteristics shown in Table 3, the X-Y shrinkage ratio, warpage, defects, and insulation resistance are characteristics of the circuit boards including conductor layers, whereas the transverse rupture strength is the characteristic of the circuit board not including any conductor layers.

TABLE 1

| | First insulating layer First glass Composition | | | | | | | | | | | | | | |
|---|---|---|---|---|---|---|---|---|---|---|---|---|---|---|---|
| Sample No. | $SiO_2$ mass % | MgO mass % | ZnO mass % | $Al_2O_3$ mass % | BaO mass % | SrO mass % | $B_2O_3$ mass % | $Y_2O_3$ mass % | CaO mass % | $Na_2O$ mass % | $SnO_2$ mass % | $P_2O_5$ mass % | $ZrO_2$ mass % | $Li_2O$ mass % | $TiO_2$ mass % |
| 1 | 23.8 | 15.4 | — | 8.4 | 26.5 | 0.4 | 17.9 | — | 4.9 | — | 1.0 | — | 1.7 | — | — |
| 2 | 22.9 | 14.9 | — | 8.1 | 30.0 | 0.3 | 17.3 | 0.1 | 4.7 | — | — | — | 1.7 | — | — |
| 3 | 22.0 | 14.2 | — | 7.8 | 33.0 | 0.3 | 16.6 | — | 4.5 | — | — | — | 1.6 | — | — |
| 4 | 23.3 | 15.1 | — | 8.2 | 26.0 | 0.4 | 20.5 | — | 4.8 | — | — | — | 1.7 | — | — |
| 5 | 21.1 | 15.5 | — | 8.5 | 26.7 | 0.4 | 21.1 | — | 4.9 | — | — | — | 1.6 | — | 0.2 |
| 6 | 22.2 | 7.2 | 14.5 | 7.9 | 24.8 | 0.3 | 16.8 | — | 4.6 | — | — | — | 1.7 | — | — |
| 7 | 24.0 | 15.6 | — | 8.5 | 26.7 | 0.4 | 18.1 | — | 4.9 | — | — | — | 1.8 | — | — |
| 8 | 24.4 | 15.8 | — | 8.6 | 27.2 | 0.4 | 18.4 | — | 5.0 | 0.2 | — | — | — | — | — |
| 9 | 22.6 | 15.9 | — | 8.6 | 27.3 | 0.4 | 18.2 | — | 5.0 | — | — | 0.2 | 1.8 | — | — |
| 10 | 21.1 | 16.2 | — | 8.8 | 27.8 | 0.4 | 18.8 | — | 5.1 | — | — | — | 1.6 | 0.2 | — |
| 11 | 11.0 | 5.2 | 14.4 | 8.0 | 29.8 | 0.3 | 20.8 | — | 8.8 | — | — | — | 1.7 | — | — |
| 12 | 19.0 | 29.5 | — | 8.5 | 21.5 | 0.4 | 14.6 | — | 4.7 | — | — | — | 1.8 | — | — |
| 13 | 29.5 | 15.8 | — | 8.6 | 22.2 | 0.4 | 18.3 | — | 5.0 | 0.2 | — | — | — | — | — |
| 14 | 17.7 | 15.9 | — | 2.0 | 27.3 | 0.4 | 29.9 | — | 4.8 | — | — | 0.2 | 1.8 | — | — |
| * 15 | 21.1 | 13.2 | — | 8.8 | 18.8 | 0.4 | 18.8 | — | 15.2 | — | — | — | 3.7 | — | — |
| 16 | 20.0 | 14.0 | — | 8.2 | 35.0 | 0.9 | 14.0 | — | 5.7 | 0.3 | — | — | 1.9 | — | — |
| * 17 | 17.7 | 4.0 | — | 8.4 | 20.0 | 0.4 | 31.0 | — | 16.5 | — | — | 0.2 | 1.8 | — | — |
| * 18 | 20.1 | 30.5 | — | 0.5 | 36.0 | 0.3 | 9.5 | — | 1.5 | — | — | — | 1.6 | — | — |
| * 19 | 36.0 | 15.1 | — | 10.8 | 11.8 | 0.5 | 22.3 | 0.9 | 1.7 | — | — | — | 0.9 | — | — |
| * 20 | 34.6 | 14.5 | — | 10.4 | 11.4 | 0.5 | 25.3 | 0.8 | 1.7 | — | — | — | 0.8 | — | — |
| * 21 | 29.3 | 17.6 | — | 12.7 | 13.8 | 0.6 | 22.1 | 1.0 | 2.0 | — | — | — | 0.9 | — | — |
| * 22 | 36.3 | 15.2 | — | 10.9 | 11.9 | 0.5 | 22.5 | — | 1.8 | — | — | — | 0.9 | — | — |
| * 23 | 16.0 | 41.0 | — | 18.0 | 7.2 | — | 15.0 | — | 1.0 | — | — | 1.5 | 0.3 | — | — |
| 24 | 18.2 | 10.2 | — | 13.3 | 38.4 | — | 14.9 | — | 3.5 | — | — | — | 1.5 | — | — |
| 25 | 20.5 | 13.2 | — | 9.5 | 36.2 | — | 15.3 | — | 3.7 | — | — | — | 1.6 | — | — |
| 26 | 18.6 | 9.9 | — | 9.6 | 41.5 | — | 15.4 | — | 3.5 | — | — | — | 1.5 | — | — |
| 27 | 17.8 | 10.5 | — | 15.5 | 36.4 | — | 14.8 | — | 3.6 | — | — | — | 1.4 | — | — |
| 28 | 16.2 | 9.8 | — | 15.7 | 41.2 | — | 13.7 | — | 2.5 | — | — | — | 0.9 | — | — |
| 29 | 16.2 | 9.5 | — | 12.6 | 44.6 | — | 14.2 | — | 1.6 | — | — | — | 1.3 | — | — |
| 30 | 15.5 | 9.9 | — | 19.2 | 40.9 | — | 13.7 | — | — | — | — | — | 0.8 | — | — |
| 31 | 20.3 | 11.4 | — | 12.9 | — | 35.5 | 14.9 | — | 3.5 | — | — | — | 1.5 | — | — |
| 32 | 17.8 | 10.2 | — | 12.9 | 11.2 | 29.7 | 14.9 | — | 2.3 | — | — | — | 1.0 | — | — |
| 33 | 18.2 | 11.1 | — | 12.9 | 22.4 | 15.5 | 14.9 | — | 3.5 | — | — | — | 1.5 | — | — |
| 34 | 20.6 | — | 7.5 | 13.7 | 39.6 | — | 13.5 | — | 3.1 | — | — | — | 2.0 | — | — |
| 35 | 19.8 | — | 15.6 | 10.6 | 37.1 | — | 12.9 | — | 2.5 | — | — | — | 1.5 | — | — |
| * 36 | 17.5 | 8.6 | — | 20.2 | 35.7 | — | 14.8 | — | 2.5 | — | — | — | 0.7 | — | — |
| * 37 | 17.4 | 8.3 | — | 11.1 | 45.4 | — | 14.5 | — | 2.5 | — | — | — | 0.8 | — | — |
| * 38 | 28.0 | 12.1 | — | 14.9 | 36.0 | — | 6.9 | — | 1.7 | — | — | — | 0.4 | — | — |
| * 39 | 31.0 | 10.7 | — | 15.0 | 27.8 | — | 13.2 | — | 1.8 | — | — | — | 0.5 | — | — |
| * 40 | 10.5 | 42.1 | — | 18.5 | 9.2 | — | 16.5 | — | — | 1.1 | 2.1 | — | — | — | — |
| * 41 | 9.8 | 42.1 | — | 9.4 | 27.9 | — | 10.8 | — | — | — | — | — | — | — | — |

TABLE 1-continued

| | First insulating layer | | | | | | Characteristics of first insulating | | |
|---|---|---|---|---|---|---|---|---|---|
| | First glass | | | | Shrinkage temperature | | substrate layer | | |
| | | | | | Shrinkage | Shrinkage | | | |
| Sample No. | Softening temperature (TS1) °C. | Glass content mass % | Ceramic filler Composition | Ceramic filler content mass % | start temperature (SA) °C. | end temperature (EA) °C. | Transverse rupture strength MPa | Dielectric loss | Thermal expansion coefficient $10^{-6}/$°C. |
|---|---|---|---|---|---|---|---|---|---|
| 1 | 704 | 60 | $Al_2O_3$ | 40 | 649 | 775 | 330 | 0.0019 | 10.7 |
| 2 | 699 | 50 | AlN | 50 | 641 | 766 | 320 | 0.0022 | 10.7 |
| 3 | 686 | 60 | $Si_3N_4$ | 40 | 634 | 763 | 310 | 0.0025 | 9.9 |
| 4 | 689 | 50 | $TiO_2$ | 50 | 633 | 759 | 270 | 0.0028 | 9.2 |
| 5 | 689 | 60 | $SrTiO_3$ | 40 | 635 | 759 | 270 | 0.0024 | 10.7 |
| 6 | 672 | 70 | $SiO_2$ | 30 | 621 | 740 | 260 | 0.0017 | 10.7 |
| 7 | 695 | 80 | $MgTiO_3$ | 20 | 644 | 763 | 270 | 0.0019 | 10.7 |
| 8 | 694 | 70 | $CaZrO_3$ | 30 | 633 | 763 | 300 | 0.0020 | 10.7 |
| 9 | 695 | 80 | $CaTiO_3$ | 20 | 644 | 758 | 250 | 0.0018 | 9.9 |
| 10 | 688 | 70 | $BaTi_4O_9$ | 30 | 638 | 763 | 250 | 0.0027 | 9.9 |
| 11 | 665 | 50 | $Al_2O_3$ | 50 | 605 | 735 | 340 | 0.0021 | 9.8 |
| 12 | 665 | 70 | $ZrO_2$ | 20 | 610 | 745 | 300 | 0.0024 | 10.3 |
| 13 | 670 | 70 | $Al_2O_3$ | 30 | 615 | 760 | 320 | 0.0015 | 10.4 |
| 14 | 650 | 80 | $Al_2O_3$ | 20 | 600 | 706 | 290 | 0.0025 | 10.6 |
| * 15 | 677 | 70 | $Al_2O_3$ | 30 | 617 | 730 | 300 | 0.0011 | 10.5 |
| 16 | 686 | 100 | — | — | 640 | 752 | 240 | 0.0030 | 9.2 |
| * 17 | 630 | 50 | $Al_2O_3$ | 50 | 585 | 705 | 280 | 0.0024 | 11.5 |
| * 18 | 655 | 60 | $Al_2O_3$ | 40 | 602 | 704 | 340 | 0.0022 | 11.8 |
| * 19 | 737 | 70 | $SrTiO_3$ | 30 | 681 | 765 | 280 | 0.0019 | 9.9 |
| * 20 | 716 | 60 | $Al_2O_3$ | 40 | 689 | 770 | 330 | 0.0016 | 9.9 |
| * 21 | 731 | 60 | $TiO_2$ | 40 | 670 | 770 | 270 | 0.0025 | 9.8 |
| * 22 | 727 | 60 | AlN | 40 | 689 | 767 | 310 | 0.0017 | 10.1 |
| * 23 | 680 | 60 | $Si_3N_4$ | 40 | 670 | 768 | 310 | 0.0014 | 10.0 |
| 24 | 680 | 80 | $Al_2O_3$ | 20 | 640 | 730 | 300 | 0.0016 | 9.2 |
| 25 | 688 | 75 | $Al_2O_3$ | 25 | 648 | 740 | 290 | 0.0017 | 8.7 |
| 26 | 671 | 75 | $Al_2O_3$ | 25 | 628 | 731 | 290 | 0.0026 | 9.1 |
| 27 | 677 | 80 | $Al_2O_3$ | 20 | 637 | 730 | 320 | 0.0015 | 9.3 |
| 28 | 678 | 80 | $Al_2O_3$ | 20 | 635 | 728 | 320 | 0.0027 | 9.6 |
| 29 | 675 | 80 | $Al_2O_3$ | 20 | 635 | 725 | 300 | 0.0030 | 9.6 |
| 30 | 691 | 80 | $Al_2O_3$ | 20 | 649 | 741 | 300 | 0.0025 | 9.7 |
| 31 | 690 | 80 | $Al_2O_3$ | 20 | 651 | 741 | 260 | 0.0017 | 8.8 |
| 32 | 685 | 75 | $Al_2O_3$ | 25 | 645 | 735 | 270 | 0.0016 | 9.3 |
| 33 | 680 | 80 | $Al_2O_3$ | 20 | 638 | 732 | 280 | 0.0017 | 9.2 |
| 34 | 692 | 80 | $Al_2O_3$ | 20 | 652 | 742 | 300 | 0.0019 | 8.7 |
| 35 | 695 | 85 | $Al_2O_3$ | 15 | 655 | 745 | 300 | 0.0021 | 8.9 |
| * 36 | 710 | 80 | $Al_2O_3$ | 20 | 672 | 760 | 320 | 0.0018 | 9.3 |
| * 37 | 670 | 80 | $Al_2O_3$ | 20 | 630 | 720 | 280 | 0.0032 | 9.4 |
| * 38 | 782 | 80 | $Al_2O_3$ | 20 | 742 | 832 | 330 | 0.0017 | 7.2 |
| * 39 | 682 | 80 | $Al_2O_3$ | 20 | 650 | 732 | 310 | 0.0015 | 6.6 |
| * 40 | 642 | 80 | $Al_2O_3$ | 20 | 631 | 697 | 250 | 0.0025 | 10.7 |
| * 41 | Evaluation impossible due to generation of residue during melting of glass in the process of preparing glass powder. | | | | | | | | |

Asterisks * indicate samples outside the preferable range.

TABLE 2

| | Second insulating layer Second glass Composition | | | | | | | | | | | | | |
|---|---|---|---|---|---|---|---|---|---|---|---|---|---|---|
| Sample No. | $SiO_2$ mass % | $Al_2O_3$ mass % | MgO mass % | BaO mass % | $B_2O_3$ mass % | $Y_2O_3$ mass % | CaO mass % | SrO mass % | $Na_2O$ mass % | $SnO_2$ mass % | $P_2O_5$ mass % | $ZrO_2$ mass % | $Li_2O$ mass % | ZnO mass % | MgO/$SiO_2$ Mass ratio |
|---|---|---|---|---|---|---|---|---|---|---|---|---|---|---|---|
| 1 | 42.9 | 12.9 | 18.0 | 14.1 | 7.5 | 1.0 | 1.7 | 0.5 | — | — | — | 1.0 | — | — | 0.42 |
| 2 | 34.0 | 14.2 | 17.3 | 18.0 | 5.0 | 4.5 | 3.5 | 0.7 | 0.1 | 0.4 | — | 1.8 | — | — | 0.51 |
| 3 | 30.0 | 10.0 | 23.0 | 17.0 | 7.3 | 4.5 | 4.1 | 0.7 | — | 0.5 | 0.1 | 2.0 | — | — | 0.77 |
| 4 | 30.0 | 10.0 | 26.0 | 21.3 | 6.0 | 2.2 | 2.1 | 0.5 | — | 0.3 | — | 0.5 | 0.2 | — | 0.87 |
| 5 | 23.8 | 24.2 | 17.3 | 18.0 | 5.0 | 4.5 | 3.5 | 0.7 | 0.1 | 0.4 | — | 1.8 | — | — | 0.73 |
| 6 | 34.0 | 14.2 | 8.0 | 20.0 | 5.0 | 4.5 | 11.1 | 0.7 | 0.1 | 0.4 | — | 1.8 | — | — | 0.24 |
| 7 | 34.0 | 14.2 | 17.3 | 10.0 | 5.0 | 4.5 | 11.5 | 0.7 | 0.1 | 0.4 | — | 1.8 | — | — | 0.51 |
| 8 | 42.9 | 12.9 | 18.0 | 14.1 | 7.5 | 1.0 | 1.7 | 0.5 | — | — | — | 1.0 | — | — | 0.42 |
| 9 | 42.9 | 12.9 | 18.0 | 14.1 | 7.5 | 1.0 | 1.7 | 0.5 | — | — | — | 1.0 | — | — | 0.42 |
| 10 | 19.5 | 24.7 | 17.3 | 18.0 | 9.4 | 4.5 | 2.8 | 0.7 | 0.1 | 0.3 | — | 1.8 | — | — | 0.89 |
| 11 | 19.0 | 13.8 | 17.3 | 18.0 | 20.0 | 4.5 | 3.5 | 0.7 | 0.1 | 0.4 | — | 1.8 | — | — | 0.91 |

TABLE 2-continued

| 12 | 62.0 | 0.2 | 8.0 | — | — | — | 13.7 | — | — | — | 0.1 | — | — | 16.0 | — |
| 13 | 47.0 | 5.0 | 18.0 | — | — | — | 29.9 | — | — | — | 0.1 | — | — | — | — |
| 14 | 42.0 | 14.2 | 8.0 | 18.0 | 5.0 | 4.5 | 5.1 | 0.7 | 0.1 | 0.4 | — | 1.8 | — | — | 0.19 |
| 15 | 43.2 | 12.5 | 16.8 | — | 7.8 | — | 18.2 | — | — | — | — | 1.5 | — | — | 0.39 |
| 16 | 42.6 | 13.2 | 16.4 | 8.5 | 8.2 | 1.0 | 1.1 | 7.5 | — | — | — | 1.5 | — | — | 0.38 |
| 17 | 19.5 | 21.5 | 21.5 | 19.9 | 7.5 | 5.5 | 2.5 | — | — | — | — | 2.1 | — | — | 1.10 |
| 18 | 22.1 | 13.2 | 16.3 | 34.8 | 8.5 | — | 3.4 | — | — | — | — | 1.7 | — | — | 0.74 |
| 19 | 46.0 | 20.0 | 6.0 | 16.2 | 7.6 | — | 4.2 | — | — | — | — | — | — | — | 0.13 |

| | Second insulating layer | | | | Shrinkage temperature | | Characteristics of second insulating substrate | | |
|---|---|---|---|---|---|---|---|---|---|
| | Second glass | | Ceramic filler | | Shrinkage | Shrinkage | | | |
| Sample No. | Softening temperature (TS1) °C. | Glass content mass % | Composition | Ceramic filler content mass % | Shrinkage start temperature (SA) °C. | Shrinkage end temperature (EA) °C. | Transverse rupture strength MPa | Dielectric loss | Thermal expansion coefficient $10^{-6}/°C$. |
| 1 | 778 | 60 | $Al_2O_3$ | 40 | 726 | 855 | 356 | 0.0010 | 8.7 |
| 2 | 840 | 65 | AlN | 35 | 786 | 910 | 350 | 0.0020 | 8.8 |
| 3 | 823 | 30 | $Si_3N_4$ | 70 | 690 | 750 | 370 | 0.0020 | 8.9 |
| 4 | 802 | 40 | $TiO_2$ | 60 | 766 | 890 | 370 | 0.0020 | 8.9 |
| 5 | 790 | 65 | $SrTiO_3$ | 35 | 730 | 833 | 375 | 0.0010 | 8.8 |
| 6 | 855 | 65 | $SiO_2$ | 35 | 785 | 910 | 350 | 0.0010 | 8.8 |
| 7 | 835 | 65 | $MgTiO_3$ | 35 | 775 | 880 | 370 | 0.0010 | 8.8 |
| 8 | 778 | 100 | — | 0 | 720 | 860 | 240 | 0.0020 | 9.0 |
| 9 | 778 | 70 | $Al_2O_3$ | 30 | 726 | 855 | 340 | 0.0010 | 8.8 |
| 10 | 785 | 65 | $CaZrO_3$ | 35 | 715 | 860 | 290 | 0.0020 | 8.8 |
| 11 | 780 | 65 | $CaTiO_3$ | 35 | 720 | 830 | 290 | 0.0010 | 8.8 |
| 12 | 900 | 65 | $BaTi_4O_9$ | 35 | 840 | 950 | 290 | 0.0025 | 11.3 |
| 13 | 808 | 60 | $ZrO_2$ | 40 | 737 | 857 | 280 | 0.0030 | 12.3 |
| 14 | 880 | 65 | $Al_2O_3$ | 35 | 820 | 930 | 350 | 0.0033 | 8.0 |
| 15 | 775 | 60 | $Al_2O_3$ | 40 | 719 | 827 | 320 | 0.0016 | 8.5 |
| 16 | 771 | 60 | $Al_2O_3$ | 40 | 715 | 824 | 340 | 0.0018 | 8.7 |
| 17 | 765 | 75 | $Al_2O_3$ | 25 | 709 | 813 | 280 | 0.0036 | 9.2 |
| 18 | 768 | 70 | $Al_2O_3$ | 30 | 712 | 825 | 330 | 0.0035 | 8.8 |
| 19 | 778 | 70 | $Al_2O_3$ | 30 | 732 | 862 | 290 | 0.0032 | 8.3 |

TABLE 3

| Substrate sample no. | First insulating layer Sample No. | Second insulating layer Sample No. | (Glass content in second insulating layer) − (glass content in first insulating layer) | | Characteristics of substrate Whole | | | | |
|---|---|---|---|---|---|---|---|---|---|
| | | | $SiO_2$ mass % | $B_2O_3$ mass % | X-Y Shrinkage ratio % | Warpage μm | Defects | Insulation resistance Ω | Transverse rupture strength MPa |
| A | 1 | 1 | 19.1 | −10.4 | 1.5 | 40 | None | $10^{11}$ | 350 |
| B | 2 | 2 | 11.1 | −12.3 | 2.0 | 45 | None | $10^{11}$ | 340 |
| C | 3 | 3 | 8.0 | −9.3 | 1.5 | 45 | None | $10^{11}$ | 360 |
| D | 4 | 4 | 6.7 | −14.5 | 4.0 | 43 | None | $10^{11}$ | 350 |
| E | 5 | 1 | 21.8 | −13.6 | 3.0 | 43 | None | $10^{11}$ | 340 |
| F | 6 | 1 | 20.7 | −9.3 | 1.5 | 42 | None | $10^{11}$ | 340 |
| G | 7 | 1 | 18.9 | −10.6 | 3.0 | 45 | None | $10^{11}$ | 340 |
| H | 8 | 1 | 18.5 | −10.9 | 3.0 | 45 | None | $10^{11}$ | 350 |
| I | 9 | 5 | 1.2 | −13.2 | 5.0 | 49 | None | $10^{11}$ | 350 |
| J | 10 | 6 | 12.9 | −13.8 | 1.2 | 30 | None | $10^{11}$ | 330 |
| K | 11 | 7 | 23.0 | −15.8 | 1.0 | 25 | None | $10^{11}$ | 360 |
| L | 16 | 1 | 22.9 | −6.5 | 1.9 | 45 | None | $10^{11}$ | 340 |
| M | 4 | 8 | 19.6 | −13.0 | 4.0 | 45 | None | $10^{11}$ | 300 |
| N | 4 | 9 | 19.6 | −13.0 | 4.0 | 45 | None | $10^{11}$ | 320 |
| * O | 12 | 10 | 0.5 | −5.2 | 5.2 | 48 | None | $10^{11}$ | 280 |
| * P | 13 | 11 | −10.5 | 1.7 | 6.5 | 55 | None | $10^{11}$ | 300 |
| * Q | 14 | 12 | 44.3 | −29.9 | 1.2 | 45 | Found | $<10^8$ | 270 |
| * R | 15 | 13 | 25.9 | −18.8 | 5.1 | 55 | Found | $<10^8$ | 280 |
| * S | 17 | 14 | 24.3 | −26.0 | 1.1 | 52 | Found | $<10^8$ | 320 |
| * T | 18 | 1 | 22.8 | −2.0 | 1.2 | 35 | Found | $10^{11}$ | 340 |
| * U | 19 | 1 | 6.9 | −14.8 | 5.6 | 56 | None | $10^{11}$ | 330 |
| * V | 20 | 1 | 8.3 | −17.8 | 5.5 | 58 | None | $10^{11}$ | 350 |
| * W | 21 | 1 | 13.6 | −14.6 | 6.6 | 78 | None | $10^{11}$ | 330 |

TABLE 3-continued

|   | Sample | | | | | | | | | |
|---|---|---|---|---|---|---|---|---|---|---|
| * | X | 22 | 1 | 6.6 | −15.0 | 5.5 | 55 | None | $10^{11}$ | 350 |
| * | Y | 23 | 1 | 26.9 | −7.5 | 5.3 | 53 | None | $10^{11}$ | 330 |
|   | Z | 24 | 1 | 24.7 | −7.4 | 0.2 | 12 | None | $10^{11}$ | 350 |
|   | AA | 25 | 1 | 22.4 | −7.8 | 0.4 | 14 | None | $10^{11}$ | 340 |
|   | AB | 26 | 1 | 24.3 | −7.9 | 0.8 | 15 | None | $10^{11}$ | 350 |
|   | AC | 27 | 1 | 25.1 | −7.3 | 1.2 | 20 | None | $10^{11}$ | 350 |
|   | AD | 28 | 1 | 26.7 | −6.2 | 1.4 | 22 | None | $10^{11}$ | 340 |
|   | AE | 29 | 1 | 26.7 | −6.7 | 3.8 | 38 | None | $10^{11}$ | 350 |
|   | AF | 30 | 1 | 27.4 | −6.2 | 3.5 | 35 | None | $10^{11}$ | 350 |
|   | AG | 31 | 1 | 22.6 | −7.4 | 2.1 | 35 | None | $10^{11}$ | 320 |
|   | AH | 32 | 1 | 25.1 | −7.4 | 1.8 | 32 | None | $10^{11}$ | 320 |
|   | AI | 33 | 1 | 24.7 | −7.4 | 1.5 | 28 | None | $10^{11}$ | 330 |
|   | AJ | 34 | 1 | 22.3 | −6.0 | 0.3 | 18 | None | $10^{11}$ | 350 |
|   | AK | 35 | 1 | 23.1 | −5.4 | 0.5 | 15 | None | $10^{11}$ | 340 |
| * | AL | 36 | 1 | 25.4 | −7.3 | 5.3 | 62 | None | $10^{11}$ | 350 |
| * | AM | 37 | 1 | 25.5 | −7.0 | 5.1 | 65 | None | $10^{11}$ | 320 |
| * | AN | 38 | 1 | 14.9 | −0.6 | 7.2 | 72 | None | $<10^{8}$ | 340 |
| * | AO | 39 | 1 | 11.9 | −5.7 | 5.3 | 68 | None | $10^{11}$ | 320 |
| * | AP | 40 | 1 | 32.4 | −7.1 | 2.1 | 33 | None | $<10^{8}$ | 310 |
|   | AQ | 24 | 15 | 25.0 | −7.1 | 0.4 | 17 | None | $10^{11}$ | 310 |
|   | AR | 24 | 16 | 24.4 | −6.7 | 0.4 | 20 | None | $10^{11}$ | 330 |
| * | AS | 24 | 17 | 1.3 | −7.4 | 4.8 | 45 | None | $<10^{8}$ | 270 |
| * | AT | 24 | 18 | 3.9 | −6.4 | 5.3 | 52 | None | $10^{11}$ | 310 |
| * | AU | 24 | 19 | 27.8 | −7.3 | 5.7 | 56 | None | $10^{11}$ | 290 |

Characteristics of substrate

| | Substrate sample no. | First insulating substrate layer | | | Second insulating substrate layer | | |
|---|---|---|---|---|---|---|---|
| | | Crystal phase | Crystallinity mass % | Aspect ratio of anisotropic crystals | Crystal phase | Crystallinity mass % | Aspect ratio of anisotropic crystals |
|   | A | C, E | 65 | >5 | C, F, S | 63 | 5 |
|   | B | C, E | 63 | >5 | C, M | 65 | >5 |
|   | C | C, E | 65 | >5 | C, Co | 63 | >5 |
|   | D | C, E | 62 | >5 | C, A | 68 | >5 |
|   | E | C, E | 68 | >5 | C, F, S | 63 | >5 |
|   | F | C, G | 67 | >5 | C, F, S | 63 | >5 |
|   | G | C, E | 54 | >5 | C, F, S | 63 | 3 |
|   | H | C, E | 58 | >5 | C, F, S | 63 | 3 |
|   | I | C, E | 55 | >5 | C, M | 70 | >5 |
|   | J | C, E | 58 | >5 | C, M | 62 | >5 |
|   | K | C, G | 74 | >5 | C, M | 62 | >5 |
|   | L | C, E | 44 | >5 | C, F, S | 63 | >5 |
|   | M | C, E | 62 | >5 | C, F, S | 33 | 5 |
|   | N | C, E | 62 | >5 | C, F, S | 60 | 5 |
| * | O | C, F | 68 | >5 | C, M | 75 | 2 |
| * | P | C, E | 53 | >5 | C, M | 73 | 2 |
| * | Q | C, E | 58 | >5 | F, D | 53 | — |
| * | R | C, E | 53 | 4 | F | 98 | — |
| * | S | C, D | 68 | 3 | C, F | 62 | 5 |
| * | T | F, B | 64 | 2 | C, F, S | 63 | 5 |
| * | U | C, E | 61 | >5 | C, F, S | 63 | 5 |
| * | V | C, E | 63 | 3 | C, F, S | 63 | 5 |
| * | W | C, E | 70 | >5 | C, F, S | 63 | 5 |
| * | X | C, E | 65 | 4 | C, F, S | 63 | 5 |
| * | Y | C, F | 67 | >5 | C, F, S | 63 | 5 |
|   | Z | C, S | 62 | >5 | C, F, S | 63 | >5 |
|   | AA | C, S | 59 | >5 | C, F, S | 63 | >5 |
|   | AB | C, S | 64 | >5 | C, F, S | 63 | >5 |
|   | AC | C, S | 67 | >5 | C, F, S | 63 | >5 |
|   | AD | C, S | 68 | >5 | C, F, S | 63 | >5 |
|   | AE | C, S | 70 | >5 | C, F, S | 63 | >5 |
|   | AF | C, S | 70 | >5 | C, F, S | 63 | >5 |
|   | AG | Su, S | 75 | >5 | C, F, S | 63 | >5 |
|   | AH | Su, C, S | 73 | >5 | C, F, S | 63 | >5 |
|   | AI | Su, C, S | 72 | >5 | C, F, S | 63 | >5 |
|   | AJ | C, G | 72 | >5 | C, F, S | 63 | >5 |
|   | AK | C, G | 75 | >5 | C, F, S | 63 | >5 |
| * | AL | C, S | 68 | >5 | C, F, S | 63 | >5 |
| * | AM | C, S | 73 | >5 | C, F, S | 63 | >5 |
| * | AN | C, S | 54 | >5 | C, F, S | 63 | >5 |
| * | AO | C, S | 53 | >5 | C, F, S | 63 | >5 |
| * | AP | C, MB | 91 | 2 | C, F, S | 63 | >5 |
|   | AQ | C, S | 62 | >5 | Su, E | 72 | >5 |
|   | AR | C, S | 62 | >5 | C, Su, E | 68 | >5 |
| * | AS | C, S | 62 | >5 | C, F | 79 | >5 |

TABLE 3-continued

| | | | | | | |
|---|---|---|---|---|---|---|
| * | AT | C, S | 62 | >5 | C, E | 82 | >5 |
| * | AU | C, S | 62 | >5 | C, S | 52 | >5 |

Asterisks * indicate samples outside the preferable range.
Abbreviations: C: celsian, D: diopside, F: forsterite, E: enstatite, Co: cordierite, A: anorthite, S: spinel M: mullite, G: gahnite,
Su: slawsonite, B: $BaSi_2O_5$, MB: $Mg_3B_2O_6$ Samples A to N, Z to AK, AQ, and AR of the circuit boards in the scope according to an embodiment of the present invention exhibited a firing shrinkage ratio of not more than 5% and warpage of 50 μm or less. No defects such as cracks and delamination were observed, and the insulation resistance of $10^9$ Ω or more per 1 mm×1 mm of the first and second insulating substrate layers was exhibited. The transverse rupture strength of the circuit board was 300 MPa or more.

In view of the above, the circuit boards according to an embodiment of the present invention have high transverse rupture strength, small firing shrinkage in the X-Y direction, and high insulation resistance of the thin layer.

In contrast, Samples O to Y, AL to AP, and AS to AU having glass compositional ranges in the first or second green sheet outside the preferable scope exhibited a firing shrinkage ratio in the X-Y direction of more than 5% and a transverse rupture strength of less than 300 MPa. Moreover, defects, warpage, and decreased insulation resistance of the thin layer were observed.

The compositions of samples prepared in Examples were analyzed with a fluorescence X-ray analyzer. The compositions of the individual insulating substrate layers were the same as the compositions of the materials prepared.

Obviously, numerous modifications and variations of the present invention are possible in light of the above teachings. It is therefore to be understood that within the scope of the appended claims, the invention may be practiced otherwise than as specifically described herein.

What is claimed is:

1. A laminate comprising:
   a first green sheet which includes a first glass comprising:
      10 to 30 percent by mass of Si in terms of $SiO_2$;
      a total of 5 to 30 percent by mass of at least one of Mg and Zn in terms of MgO and ZnO, respectively; wherein the total amount of MgO and ZnO is 5 to 30 percent by mass;
      10 to 30 percent by mass of B in terms of $B_2O_3$; and
      Al and M which is at least one of Sr and Ba, a relationship between Al content and M content being so defined that a position represented by percent by mass of Al in terms of $Al_2O_3$ and percent by mass of M in terms of MO on a coordinate system are on or in a range defined by straight lines connecting point A (Al=1, M=21), point B (Al=1, M=35), point C (Al=9, M=45), point D (Al=20, M=45), point E (Al=20, M=35), and point F (Al=9, M=21) on the coordinate system; and
   a second green sheet which includes a second glass comprising:
      Si whose percent by mass in terms of $SiO_2$ is larger than the percent by mass of Si in terms of $SiO_2$ of the first glass by 1 to 40 percent by mass; and
      B whose content in terms of $B_2O_3$ is 3 percent by mass or more and at least 5 percent by mass less than the B content in terms of $B_2O_3$ of the first glass, the first green sheet being integrally laminated with the second green sheet,
   wherein the second glass contains 20 to 60 percent by mass of Si in terms of $SiO_2$, 10 to 25 percent by mass of Al in terms of $Al_2O_3$, 8 to 35 percent by mass of Mg in terms of MgO, and 10 to 20 percent by mass of M in terms of MO, and
   wherein a ratio $MgO/SiO_2$ of MgO to $SiO_2$ is in a range of 0.20 to 0.87.

2. The laminate according to claim 1,
   wherein the relationship between the Al content and the M content is so defined that the position represented by the percent by mass of Al in terms of $Al_2O_3$ and the percent by mass of M in terms of MO on the coordinate system are on or in a range defined by straight lines connecting point A (Al=1, M=21), point B (Al=1, M=35), point G (Al=9, M=35), and point F (Al=9, M=21) on the coordinate system, and
   wherein the first glass further comprises a total of 5 to 20 percent by mass of at least one of $Y_2O_3$, CaO, $TiO_2$, and $Na_2O$.

3. The laminate according to claim 1,
   wherein the relationship between the Al content and the M content is so defined that the position represented by the percent by mass of Al in terms of $Al_2O_3$ and the percent by mass of M in terms of MO on the coordinate system are on or in a range defined by straight lines connecting point A (Al=1, M=21), point B (Al=1, M=35), point G (Al=9, M=35), and point F (Al=9, M=21) on the coordinate system,
   wherein the Mg content in the first glass is 5 to 30 percent by mass in terms of MgO, and
   wherein the first glass further comprises a total of 5 to 20 percent by mass of at least one of $Y_2O_3$, CaO, SrO, ZnO, $TiO_2$, $Na_2O$, $SnO_2$, $P_2O_5$, $ZrO_2$, and $Li_2O$.

4. The laminate according to claim 1, wherein the relationship between the Al content and the M content is so defined that the position represented by the percent by mass of Al in terms of $Al_2O_3$ and the percent by mass of M in terms of MO on the coordinate system is on or in a range defined by straight lines connecting point C (Al=9, M=45), point D (Al=20, M=45) point E (Al=20, M=35), and point G (Al=9, M=35) on the coordinate system.

5. The laminate according to claim 1,
   wherein the first green sheet includes an inorganic composition containing 30 to 100 percent by mass of the first glass and 0 to 70 percent by mass of a first ceramic, and
   wherein the second green sheet includes an inorganic composition containing 30 to 100 percent by mass of the second glass and 0 percent by mass and not more than 70 percent by mass of a second ceramic.

6. The laminate according to claim 1, wherein a softening temperature of the first glass is lower than a softening temperature of the second glass.

7. The laminate according to claim 1, wherein a firing shrinkage start temperature of the first green sheet is lower than a firing shrinkage start temperature of the second green sheet.

8. A ceramic substrate prepared by firing the laminate according to claim 1, comprising:

a first insulating substrate layer prepared by sintering the first green sheet and incorporating anisotropic crystals having an aspect ratio of 3 or more as a main crystal phase; and a second insulating substrate layer prepared by sintering the second green sheet.

9. The ceramic substrate according to claim 8, wherein the anisotropic crystals are at least one of crystals selected from celsian and slawsonite.

10. The ceramic substrate according to claim 8, wherein crystallinity of the first insulating substrate layer is 75 percent or less.

11. The ceramic substrate according to claim 8, further comprising a wiring circuit on a surface of and/or inside the first insulating substrate layer and/or the second insulating substrate layer.

12. A method for making a ceramic substrate, comprising:
a step of preparing a first green sheet which includes a first glass comprising:
10 to 30 percent by mass of Si in terms of $SiO_2$;
a total of 5 to 30 percent by mass of at least one of Mg and Zn in terms of MgO and ZnO, respectively;
10 to 30 percent by mass of B in terms of $B_2O_3$; and
Al and M which is at least one of Sr and Ba, a relationship between Al content and M content being so defined that a position represented by percent by mass of Al in terms of $Al_2O_3$ and percent by mass of M in terms of MO on a coordinate system is on or in a range defined by straight lines connecting point A (Al=1, M=21), point B (Al=1, M=35), point C (Al=9, M=45), point D (Al=20, M=45), point E (Al=20, M=35), and point F (Al=9, M=21) on the coordinate system;
a step of preparing a second green sheet which includes a second glass comprising:
Si whose percent by mass in terms of $SiO_2$ is larger than the percent by mass of Si in terms of $SiO_2$ in the first glass by 1 to 40 percent by mass; and
B whose content in terms of $B_2O_3$ is 3 percent by mass or more and at least 5 percent by mass less than the B content in terms of $B_2O_3$ in the first glass;
a step of laminating the first green sheet and the second green sheet to prepare a laminate; and
a step of firing the laminate by shrinking the first green sheet and then shrinking the second green sheet so that a shrinkage ratio in an X-Y direction parallel to a main surface of each green sheet is 5% or less.
wherein the second glass contains 20 to 60 percent by mass of Si in terms of $SiO_2$, 10 to 25 percent by mass of Al in terms of $Al_2O_3$, 8 to 35 percent by mass of Mg in terms of MgO, and 10 to 20 percent by mass of M which is at least one of Sr and Ba in terms of MO, and
wherein a ratio $MgO/SiO_2$ of MgO to $SiO_2$ is in a range of 0.20 to 0.87.

13. The method according to claim 12,
wherein the relationship between the Al content and the M content is so defined that the position represented by the percent by mass of Al in terms of $Al_2O_3$ and the percent by mass of M in terms of MO on the coordinate system is on or in a range defined by straight lines connecting point A (Al=1, M=21), point B (Al=1, M=35), point G (Al=9, M=35), and point F (Al=9, M=21) on the coordinate system, and
wherein the first glass further contains a total of 5 to 20 percent by mass of at least one of $Y_2O_3$, CaO, $TiO_2$, and $Na_2O$.

14. The method according to claim 12, wherein the relationship between the Al content and the M content is so defined that the position represented by the percent by mass of Al in terms of $Al_2O_3$ and the percent by mass of M in terms of MO on the coordinate system are on or in a range defined by straight lines connecting point A (Al=1, M=21), point B (Al=1, M=35), point G (Al=9, M=35), and point F (Al=9, M=21) on the coordinate system,
wherein the Mg content in the first glass is 5 to 30 percent by mass in terms of MgO, and
wherein the first glass further contains a total of 5 to 20 percent by mass of at least one of $Y_2O_3$, CaO, SrO, ZnO, $TiO_2$, $Na_2O$, $SnO_2$, $P_2O_5$, $ZrO_2$, and $Li_2O$.

15. The method according to claim 12, wherein the relationship between the Al content and the M content is so defined that the position represented by the percent by mass of Al in terms of $Al_2O_3$ and the percent by mass of M in terms of MO on the coordinate system is on or in a range defined by straight lines connecting point C (Al=9, M=45), point D (Al=20, M=45) point E (Al=20, M=35), and point G (Al=9, M=35) on the coordinate system.

16. The method according to claim 12,
wherein the first green sheet includes an inorganic composition containing 30 to 100 percent by mass of the first glass and 0 to 70 percent by mass of a first ceramic, and
wherein the second green sheet includes an inorganic composition containing 30 to 100 percent by mass of the second glass and more than 0 percent by mass and not more than 70 percent by mass of a second ceramic.

17. The method according to claim 12, wherein a softening temperature of the first glass is lower than a softening temperature of the second glass.

18. The method according to claim 12, wherein a firing shrinkage start temperature of the first green sheet is lower than a firing shrinkage start temperature of the second green sheet.

19. The method according to claim 12, further comprising:
a step of forming a conductor layer on a surface of and/or in the first green sheet and/or the second green sheet prior to the step of preparing the laminate of the green sheets.

* * * * *